US012652068B2

(12) United States Patent
Meesaraganda et al.

(10) Patent No.: US 12,652,068 B2
(45) Date of Patent: Jun. 9, 2026

(54) COMPENSATION METHODS AND DEVICES FOR DIGITAL POWER AMPLIFIER

(71) Applicant: Morse Micro Pty. Ltd., Surry Hills (AU)

(72) Inventors: Surendra Raju Meesaraganda, Bangalore (IN); Justin Penfold, Surry Hills (AU); Philip Rowe, Surry Hills (AU)

(73) Assignee: Morse Micro Pty. Ltd., Surry Hills (AU)

( * ) Notice: Subject to any disclaimer, the term of this patent is extended or adjusted under 35 U.S.C. 154(b) by 55 days.

(21) Appl. No.: 18/916,918

(22) Filed: Oct. 16, 2024

(65) Prior Publication Data

US 2026/0019096 A1     Jan. 15, 2026

(30) Foreign Application Priority Data

Jul. 15, 2024     (AU) ................................ 2024902178

(51) Int. Cl.
| | |
|---|---|
| *H04B 1/04* | (2006.01) |
| *H03F 3/24* | (2006.01) |
| *H03G 3/30* | (2006.01) |

(52) U.S. Cl.
CPC ........... *H04B 1/0475* (2013.01); *H03F 3/245* (2013.01); *H03G 3/3042* (2013.01); *H03G 2201/103* (2013.01); *H03G 2201/307* (2013.01); *H04B 2001/0425* (2013.01)

(58) Field of Classification Search
CPC .. H04B 10/61; H04B 10/2575; H04B 7/0452; H04B 1/04; H04L 27/3818; H04L 1/0038; H04L 27/367; H03F 1/347; H03F 3/211

USPC .......................... 375/297; 330/149; 455/63.1
See application file for complete search history.

(56) References Cited

U.S. PATENT DOCUMENTS

| | | | | |
|---|---|---|---|---|
| 2005/0157815 | A1* | 7/2005 | Kim ...................... | H04L 27/364 |
| | | | | 375/302 |
| 2012/0329512 | A1* | 12/2012 | Premakanthan ..... | H03G 3/3042 |
| | | | | 455/550.1 |
| 2016/0173304 | A1* | 6/2016 | Le Taillandier De Gabory .......... | |
| | | | | H04B 10/5561 |
| | | | | 398/76 |
| 2022/0109460 | A1* | 4/2022 | Liu ..................... | H03M 1/0863 |
| 2022/0393707 | A1* | 12/2022 | Tong ........................ | H04B 1/04 |

(Continued)

*Primary Examiner* — Khai Tran
(74) *Attorney, Agent, or Firm* — Polsinelli PC

(57)     ABSTRACT

Systems and techniques are provided for power amplifier gain error compensation for a Digital Power Amplifier (DPA). In some aspects, a compensation method includes obtaining in-phase (I) and quadrature-phase (Q) components of a baseband sample corresponding to in-phase input amplitude codes and quadrature-phase input amplitude codes. The in-phase input amplitude codes can be distorted based on first gain pre-compensation information corresponding to an in-phase signal branch of the DPA, to generate pre-distorted output amplitude codes of the I component. The quadrature-phase input amplitude codes can be distorted based on second gain pre-compensation information corresponding to a quadrature-phase signal branch of the DPA, to generate pre-distorted output amplitude codes of the Q component. The DPA can be driven using the pre-distorted output amplitude codes of the I and Q components to generate a Radio Frequency (RF) output.

18 Claims, 18 Drawing Sheets

(56) References Cited

U.S. PATENT DOCUMENTS

| 2024/0113807 A1* | 4/2024 | Dorrance | .............. | H04L 1/0009 |
| 2025/0253954 A1* | 8/2025 | Burke | .............. | H04B 10/25759 |

* cited by examiner

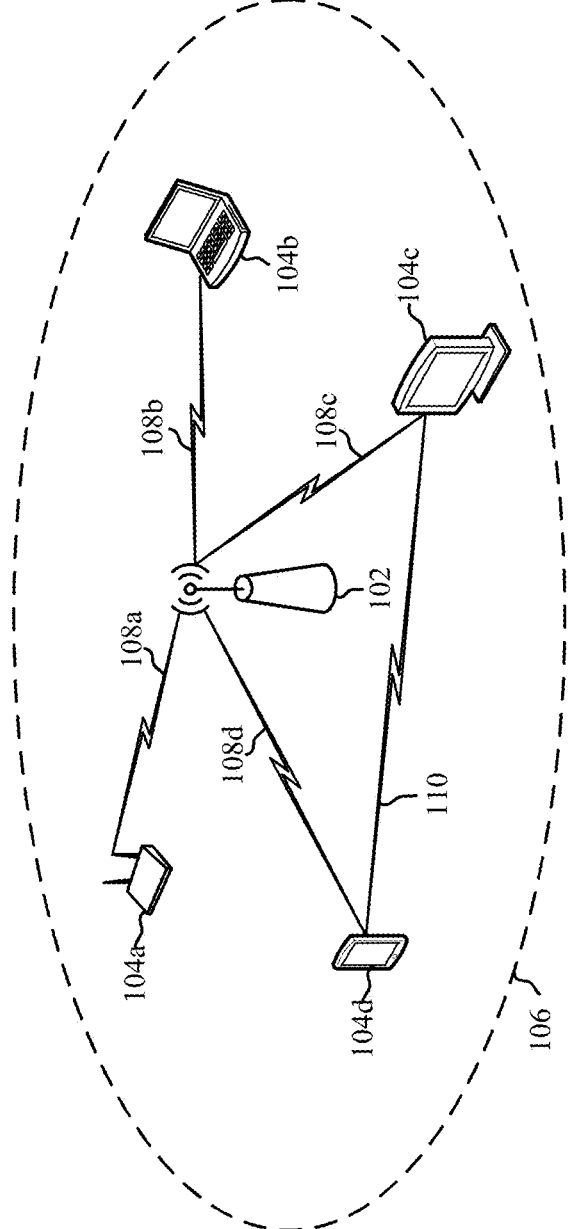
FIG. 1

300

310

$I = 0$ to $(2^{14}-1)$ $Q = (2^{15}-1)$ to $2^{14}$

340

330

$Q = 0$ to $(2^{14}-1)$ $I = (2^{15}-1)$ to $2^{14}$ $\Sigma$ $G(1+\delta)$ $G(1-\delta)$

400

RF Output

1

0.5

410

I $\delta/2$ $\delta/2$

430

Q

0

$2^{14}$ $2^{15}$

Amplitude Code

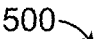
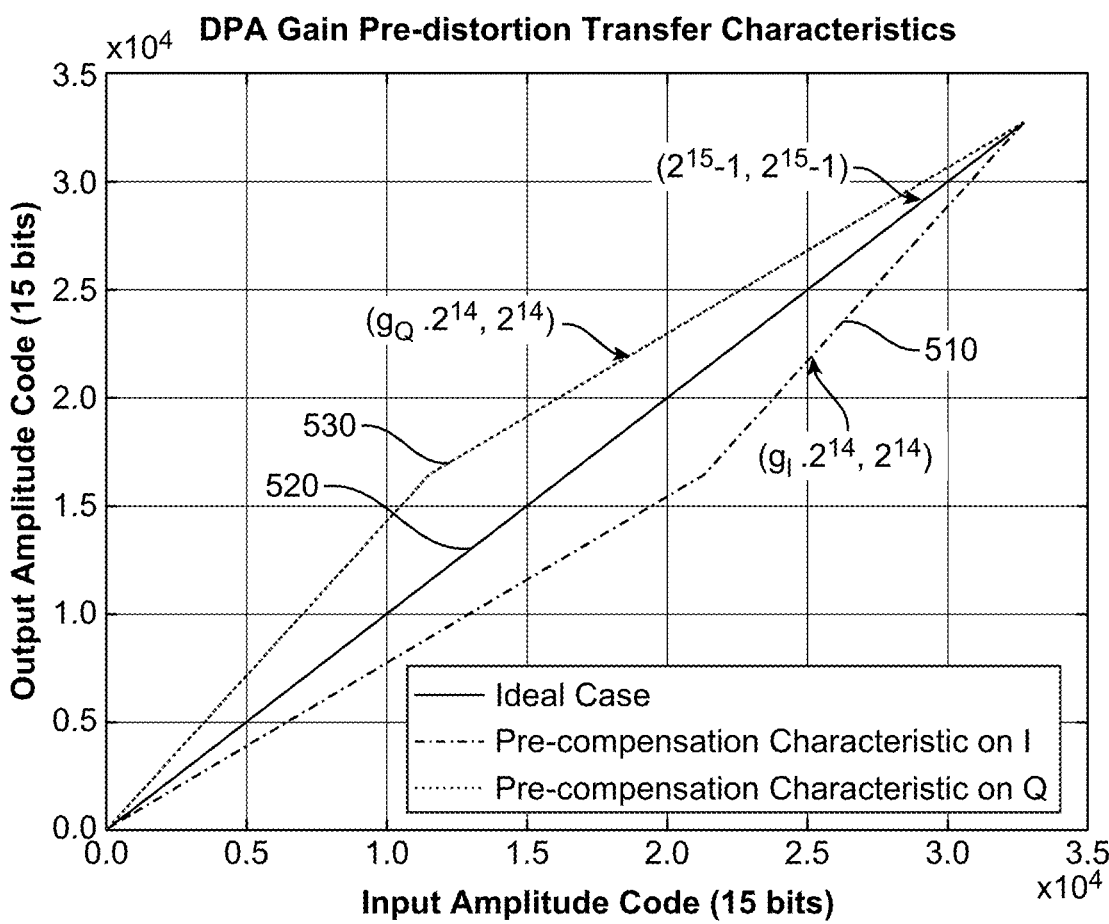
FIG. 5

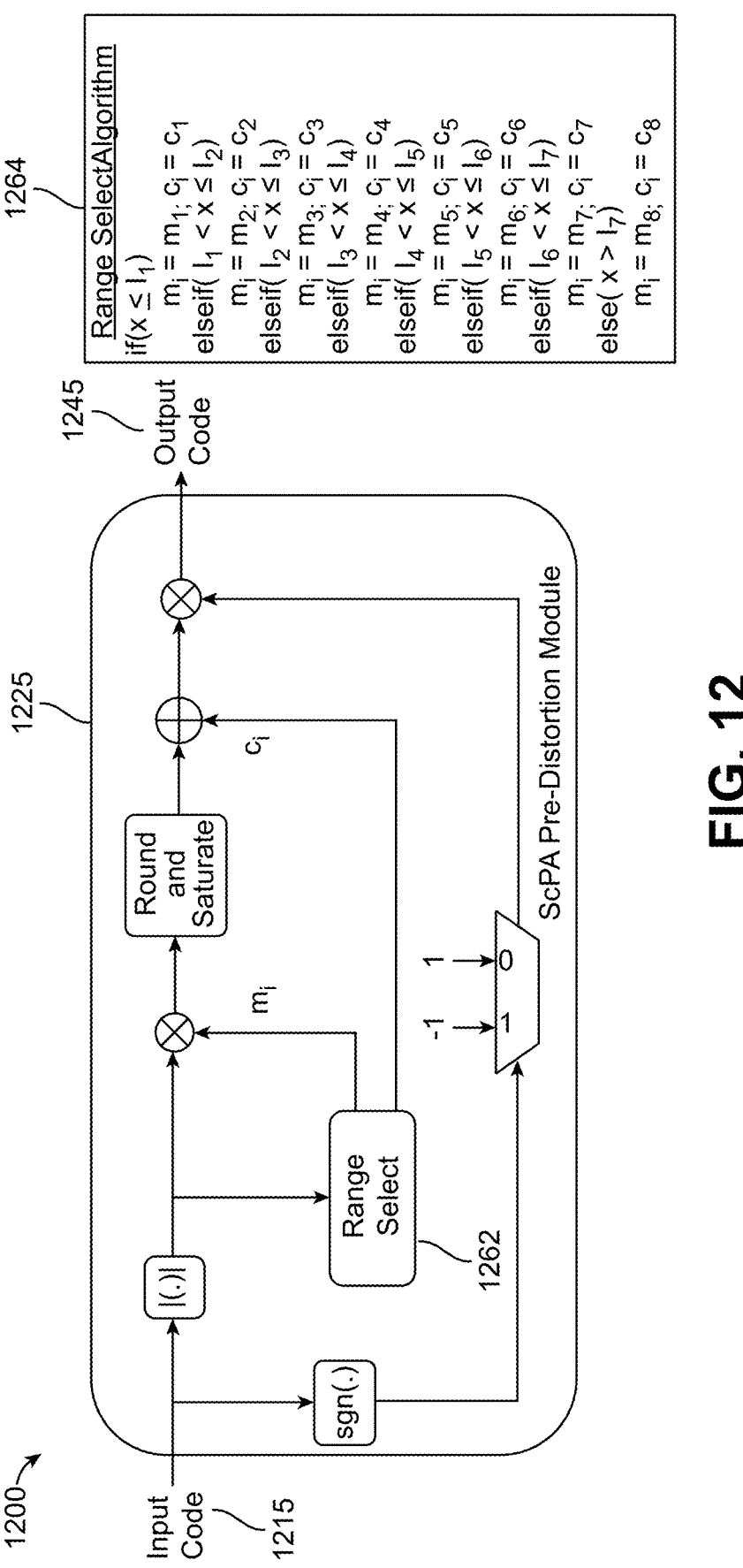

Range SelectAlgorithm

$$
\begin{aligned}
&\text{if}(x \leq l_1) \\
&\qquad m_i = m_1;\ c_i = c_1 \\
&\text{elseif}(l_1 < x \leq l_2) \\
&\qquad m_i = m_2;\ c_i = c_2 \\
&\text{elseif}(l_2 < x \leq l_3) \\
&\qquad m_i = m_3;\ c_i = c_3 \\
&\text{elseif}(l_3 < x \leq l_4) \\
&\qquad m_i = m_4;\ c_i = c_4 \\
&\text{elseif}(l_4 < x \leq l_5) \\
&\qquad m_i = m_5;\ c_i = c_5 \\
&\text{elseif}(l_5 < x \leq l_6) \\
&\qquad m_i = m_6;\ c_i = c_6 \\
&\text{elseif}(l_6 < x \leq l_7) \\
&\qquad m_i = m_7;\ c_i = c_7 \\
&\text{else}(x > l_7) \\
&\qquad m_i = m_8;\ c_i = c_8
\end{aligned}
$$

1264

1245

Output Code

1225

1262

Range Select

Round and Saturate $m_i$ $c_i$ $|(.)|$ sgn(.)

1
0
-1
1

ScPA Pre-Distortion Module

Input Code
1215

Obtain an in-phase (I) component and a quadrature-phase (Q) component of a baseband sample, wherein the I component is associated with in-phase input amplitude codes and the Q component is associated with quadrature-phase input amplitude codes
1702

Distort the in-phase input amplitude codes, based on first gain pre-compensation information corresponding to an in-phase signal branch of a Digital Power Amplifier (DPA), to thereby generate pre-distorted output amplitude codes of the I component
1704

Distort the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information
1706

Drive the DPA using the pre-distorted output amplitude codes of the I and Q components to generate a Radio Frequency (RF) output
1708

FIG. 17

COMPENSATION METHODS AND DEVICES FOR DIGITAL POWER AMPLIFIER

CROSS-REFERENCE TO RELATED APPLICATIONS

This application claims the benefit of Australian Provisional Patent Application No. 2024902178, filed Jul. 15, 2024, which is hereby incorporated by reference, in its entirety and for all purposes.

FIELD

The present disclosure generally relates to wireless communications. For example, aspects of the present disclosure are related to power amplifier gain error compensation for a Digital Power Amplifier (DPA) transmitting a radio frequency signal on a wireless medium.

BACKGROUND

Power Amplifiers (PAs) are used in Radio Frequency (RF) transmitters for transmission of electromagnetic energy. Power amplifier efficiency highly influences power consumption in wireless transceivers. Recently, Digital Power Amplifiers (DPAs) have seen growing interest, as a DPA can integrate multiple functions and/or functionalities, such as a Digital to Analog Converter (DAC), a frequency up-converter/mixer, and a PA. The use of a DPA in an RF transceiver can improve the energy efficiency and reduce the power consumption of the RF transceiver, and can additionally reduce the chip area associated with the physical implementation of the RF transceiver (e.g., based on the multiple functions integrated into or by the DPA). A 'high power' DPA can be associated with a relatively high power consumption, and may employ various techniques to optimize efficiency. However, the efficiency optimization(s) used by existing high power DPAs may also introduce distortion, particularly when the input amplitude codes driving the DAC (e.g., the DAC included or integrated within the DPA) are large.

In-phase (I) and Quadrature-phase (Q) components of an input signal may be separated and coupled to different sections of the DPA. Coding circuits within the DPA are used for mapping the respective amplitudes of the I and Q components to drive these separate sections of the DPA. The signals from each section are then summed (e.g., recombined) to generate the final output of the DPA. A Switched capacitor Power amplifier (ScPa) is a type of DPA, which uses capacitors, along with transistors acting as switches, to achieve high linearity and efficiency, especially at higher output power levels. In an ScPa architecture, capacitors in arrays may be selectively driven (or not driven) by an input clock signal, to thereby be turned on or off. This selective activation of capacitors can be controlled by amplitude codes derived from the amplitudes of the I and Q components of the input signal. For example, the amplitudes of the I and Q components can be coded into amplitude codes, and used to control which capacitors in each capacitor array of the ScPa are turned on.

BRIEF SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

Disclosed are systems, methods, apparatuses, and computer-readable media for power amplifier gain error compensation for a Digital Power Amplifier (DPA). According to at least one illustrative example, a method for signal compensation to digitally correct a gain characteristic of a DPA is provided. For example, a compensation method for digitally correcting a gain characteristic of a Digital Power Amplifier (DPA) is provided, the method comprising: obtaining an in-phase (I) component and a quadrature-phase (Q) component of a baseband sample, wherein the I component is associated with in-phase input amplitude codes and the Q component is associated with quadrature-phase input amplitude codes; distorting the in-phase input amplitude codes, based on first gain pre-compensation information corresponding to an in-phase signal branch of the DPA, to thereby generate pre-distorted output amplitude codes of the I component; distorting the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information; and driving the DPA using the pre-distorted output amplitude codes of the I and Q components to generate a Radio Frequency (RF) output.

In some aspects, the RF output is a compensated RF output without gain error distortion.

In some aspects, a non-linear gain applied by the DPA to generate the RF output is canceled by a respective pre-distortion associated with each of the pre-distorted output amplitude codes of the I component and the Q component.

In some aspects, the DPA is a multi-section DPA including a plurality of sections arranged in a multi-section DPA configuration.

In some aspects, the compensation method further comprises: estimating a respective gain from each section of the plurality of sections in the multi-section DPA configuration; and deriving the first gain pre-compensation information and the second gain pre-compensation information based on the respective gain estimated from each section.

In some aspects, the first gain pre-compensation information comprises a first pre-distortion characteristic comprising a first piecewise linear function over the plurality of sections of the multi-section DPA configuration; and the second gain pre-compensation information comprises a second pre-distortion characteristic comprising a second piecewise linear function over the plurality of sections of the multi-section DPA configuration.

In some aspects, a number of linear sections included within the first or second piecewise linear functions corresponds to a number of sections in the multi-section DPA configuration.

In some aspects, the DPA is a Switched-capacitor Power amplifier (ScPa) including a plurality of sections.

In some aspects, the DPA includes at least a first section and a second section; a range of possible output amplitude codes of the I component is divided into a first interval and a second interval; and a range of possible output amplitude codes of the Q component is divided into a first interval and a second interval.

In some aspects, the first section of the DPA is controlled by one or more of: pre-distorted output amplitude codes of the I component within the first interval or pre-distorted output amplitude codes of the Q component within the second interval; and the second section of the DPA is controlled by one or more of: pre-distorted output amplitude codes of the Q component within the first interval or pre-distorted output amplitude codes of the I component within the second interval.

In some aspects, the compensation method further comprises compensating a Phase Modulation (PM)-Amplitude Modulation (AM) distortion of the baseband sample according to a phase component of the baseband sample.

In some aspects, the DPA is a multi-section DPA including a plurality of sections, and compensating the PM-AM distortion includes: converting initial I and Q components of the baseband sample into an amplitude component and the phase component; selecting a respective section from the plurality of sections of the multi-section DPA, wherein the respective section is selected based on the phase component of the baseband sample, and wherein the respective section is associated with a slope and an intercept corresponding to a gain characteristic of the multi-section DPA within the respective section; deriving an amplitude correction value for the baseband sample based on the slope and the intercept corresponding to the gain characteristic of the multi-section DPA within the respective section; computing a pre-distorted amplitude for the baseband sample from the amplitude component and the amplitude correction value, wherein the I and Q components of the baseband samples are generated using the pre-distorted amplitude.

In some aspects, the compensation method further compensating an Amplitude Modulation (AM)-Phase Modulation (PM) distortion of the baseband sample according to the I and Q components of the baseband sample.

In some aspects, the DPA is a multi-section DPA including a plurality of sections, and compensating the AM-PM distortion includes: selecting a respective section from the plurality of sections of the multi-section DPA, wherein the respective section is selected based on an initial Q component of the baseband sample, and wherein the respective section is associated with a slope and an intercept corresponding to a gain characteristic of the multi-section DPA within the respective section; deriving a phase error based on the slope and the intercept corresponding to the gain characteristic of the multi-section DPA within the respective section; and computing a pre-compensated output based on an initial I component of the baseband sample and the phase error, wherein the I component of the baseband sample is the pre-compensated output.

In some aspects, the DPA is a multi-section DPA including a plurality of sections, and compensating the AM-PM distortion includes: selecting a respective section from the plurality of sections of the multi-section DPA, wherein the respective section is selected based on an initial I component of the baseband sample, and wherein the respective section is associated with a slope and an intercept corresponding to corresponding to a gain characteristic of the multi-section DPA within the respective section; deriving a phase error based on the slope and the intercept corresponding to the gain characteristic of the multi-section DPA within the respective section; and computing a pre-compensated output based on an initial Q component of the baseband sample and the phase error, wherein the Q component of the baseband sample is the pre-compensated output.

In another illustrative example, a compensation method for digitally correcting amplitudes of baseband samples associated with a transmission by a Digital Power Amplifier (DPA) is provided, the method comprising: obtaining an amplitude component and a phase component of a baseband sample; selecting, based on the phase component of the baseband sample, a respective section from a plurality of sections included in the DPA; determining a slope and an intercept corresponding to a gain characteristic or a gain error of the DPA within the respective section; deriving an amplitude correction value for the baseband sample based on the slope and the intercept; computing a pre-distorted amplitude for the baseband sample from the amplitude component and the amplitude correction value; generating an In-phase (I) signal component and a Quadrature-phase (Q) signal component for the baseband sample, based on using the pre-distorted amplitude and the phase component; and driving the DPA using the I and Q signal components to generate Radio Frequency (RF) output.

In another illustrative example, a compensation method for digitally correcting amplitudes of baseband samples associated with a transmission by a Digital Power Amplifier (DPA) is provided, the method comprising: obtaining an In-phase (I) component and a Quadrature-phase (Q) component of a baseband sample; determining a selected I segment from a plurality of I segment ranges configured for the DPA, wherein the selected I segment is selected based on a value of the I component of the baseband sample; determining an I slope and an I intercept corresponding to the selected I segment; determining a selected Q segment from a plurality of Q segment ranges configured for the DPA, wherein the selected Q segment is selected based on a value of the Q component of the baseband sample; determining a Q slope and a Q intercept corresponding to the selected Q segment; deriving a Q phase error based on the I slope and the I intercept, and deriving an I phase error based on the Q slope and the Q intercept; computing a pre-compensated Q output from the Q component and the Q phase error, and computing a pre-compensated I output from the I component and the I phase error; and driving the DPA using the pre-compensated I and Q outputs to generate a Radio Frequency (RF) output.

In another illustrative example, a wireless device transmitting Radio Frequency (RF) signal on a wireless medium is provided, the wireless device comprising: one or more digital filters configured to receive and upsample an In-phase (I) component and a Quadrature-phase (Q) component of a baseband sample, wherein the I component is associated with in-phase input amplitude codes and the Q component is associated with quadrature-phase input amplitude codes; a Power Amplifier (PA) gain error compensation module coupled to the one or more digital filters, wherein the PA gain error compensation module is configured to: distort the in-phase input amplitude codes, based on first gain pre-compensation information corresponding to an in-phase signal branch of the DPA, to thereby generate pre-distorted output amplitude codes of the I component; and distort the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information; and a Digital Power Amplifier (DPA) coupled to the PA gain error compensation module, the DPA configured to generate an RF output based on the pre-distorted output amplitude codes of the I and Q components.

In some aspects, the wireless device further comprises one or more of: a Phase Modulation (PM)-Amplitude Modulation (AM) compensation module coupled to the one or more digital filters and the PA gain error compensation module, wherein the PM-AM compensation module is configured to correct a PM-AM distortion of the baseband sample based on a phase component of the baseband sample; or an AM-PM compensation module coupled to the one or more digital filters and the PA gain error compensation module, wherein the AM-PM compensation module is configured to correct an AM-PM distortion of the baseband sample based on phase errors derived from the I and Q components of the baseband sample.

In some aspects, the wireless device further comprises: a cartesian to polar converter coupled to the one or more digital filters and configured to convert the I and Q components of the baseband sample into an amplitude component and the phase component; wherein the PM-AM compensation module is further configured to: determine a selected section from a plurality of sections included in the DPA based on the phase component of the baseband sample, wherein the selected section is associated with a slope and an intercept corresponding to the selected section; derive an amplitude correction value for the baseband sample based on the slope and the intercept of the selected section; and compute a pre-distorted amplitude for the baseband sample from the amplitude component and the amplitude correction value; and wherein the PA gain error compensation module is configured to receive the I and Q components of the baseband samples derived using the pre-distorted amplitude computed by the PM-AM compensation module.

Other objects and advantages associated with the aspects disclosed herein will be apparent to those skilled in the art based on the accompanying drawings and detailed description.

BRIEF DESCRIPTION OF THE DRAWINGS

Illustrative aspects of the present application are described in detail below with reference to the following drawing figures:

FIG. 1 is a block diagram illustrating an exemplary wireless communication network;

FIG. 5 is a graph illustrating an example of pre-distortion transfer characteristics for a pre-distortion module that can be used to provide pre-compensation for the I and Q signal components of a DPA, in accordance with some embodiments;

FIG. 12 is a diagram illustrating an example architecture of the DPA pre-compensation module of FIG. 11, in accordance with some embodiments;

FIG. 17 is a flow diagram of an example process for performing signal compensation to digitally correct a gain characteristic of a Digital Power Amplifier (DPA), in accordance with some embodiments.

DETAILED DESCRIPTION

Figure 2A:
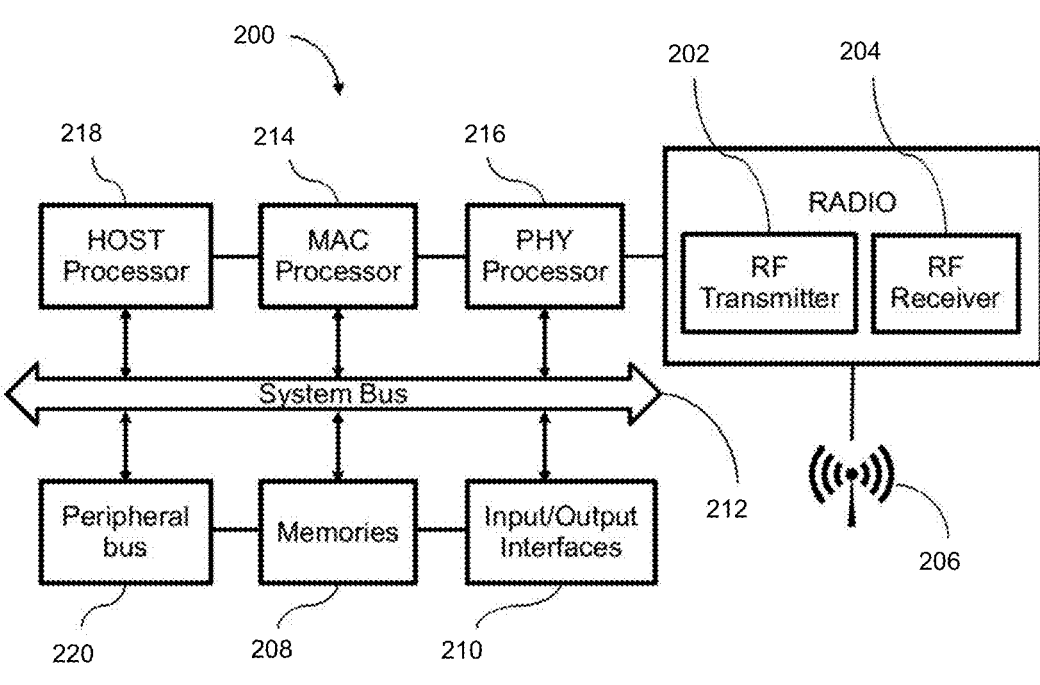
FIG. 2A is a block diagram of a wireless communication device that can implement a station (STA) or access point (AP), in accordance with some embodiments.

Certain aspects of this disclosure are provided below. Some of these aspects may be applied independently and some of them may be applied in combination as would be apparent to those of skill in the art. In the following description, for the purposes of explanation, specific details are set forth in order to provide a thorough understanding of aspects of the application. However, it will be apparent that various aspects may be practiced without these specific details. The figures and description are not intended to be restrictive.

The ensuing description provides example aspects only, and is not intended to limit the scope, applicability, or configuration of the disclosure. Rather, the ensuing description of the example aspects will provide those skilled in the art with an enabling description for implementing an example aspect. It should be understood that various changes may be made in the function and arrangement of elements without departing from the spirit and scope of the application as set forth in the appended claims.

Overview

Aspects of the present invention can be used to provide novel and effective methods of power amplifier gain error compensation. For example, the systems and techniques described herein can be used to perform signal compensation to digitally correct a gain characteristic of a Digital Power Amplifier (DPA) (e.g., such as a DPA in a wireless device transmitting Radio Frequency (RF) signal on a Wireless Medium (WM), etc.). In some embodiments, the DPA can include or implement one or more pre-distortion modules that are used to apply a configured distortion to an input signal or input signal component provided to each pre-distortion module of the DPA.

For example, the DPA pre-distortion module(s) can be configured to digitally pre-distort baseband samples in order to generate pre-distorted samples to thereby cancel the non-linear gain effect of the DPA. Canceling the non-linear gain effect of the DPA can result in the output of the DPA being ideal or near ideal. In some embodiments, the DPA pre-distortion modules can digitally pre-distort the baseband samples according to the non-linear gain effect of the DPA. The resulting pre-distorted samples are then processed by the DPA, which applies the known non-linear gain effect to the pre-distorted samples. The application of the known DPA non-linear gain effect to the pre-distorted samples results in the cancellation of the non-linear gain effect, and the DPA output is thus ideal or near ideal.

Another aspect of the invention corresponds to systems and techniques for digitally compensating a Phase Modulation (PM)-Amplitude Modulation (AM) distortion (e.g., PM-AM distortion) that may also be introduced due to the architecture of the DPA. For example, amplitude components of baseband samples can be pre-distorted by a PM-AM compensation module, where the pre-distortion is according to and/or configured based on the corresponding phase components of the baseband samples. The pre-distortion of the PM-AM compensation module can be applied to the baseband samples prior to input to the DPA, in order to reduce the variation in amplitudes depending on the phase of the baseband samples.

Example Embodiments

FIG. 1 is a block diagram illustrating an exemplary wireless communication network 100. In some aspects, the wireless communication network 100 can be an example of a Wireless Local Area Network (WLAN). As used herein, a WLAN may be a Wi-Fi network. In some examples, the WLAN 100 can be a network implementing at least one of the IEEE 802.11 family of wireless communication protocol standards (e.g., such as that defined by the IEEE 802.11-2020 specification or amendments thereof including, but not limited to, 802.11ah, 802.11ay, 802.11ax, 802.11az, 802.11ba and 802.11be). The WLAN 100 may include at least one AP 102 and multiple associated STAs 104. For example, the STAs 104 can include a first STA 104a, a second STA 104b, a third STA 104c, a fourth STA 104d, etc. While only one AP 102 is shown, the WLAN network 100 also can include multiple APs 102.

Each of the STAs 104a-104d may be referred to as a Mobile Station (MS), a mobile device, a mobile handset, a wireless handset, an Access Terminal (AT), a User Equipment (UE), a Subscriber Station (SS), and/or a subscriber unit, among other examples. The STAs 104 may represent various devices such as mobile phones, handheld devices, netbooks, computers, tablet computers, laptops, display devices (e.g., TVs, computer monitors, navigation systems, etc.), music or other audio or stereo devices, remote control devices ("remotes"), printers, kitchen or other household appliances, key fobs (e.g., for Passive Keyless Entry and Start (PKES) systems), etc.

A single AP 102 and an associated set of STAs 104a-104d may be referred to as a Basic Service Set (BSS), which is managed by the respective AP 102. FIG. 1 additionally shows an example coverage area 106 of the AP 102, which may represent a Basic Service Area (BSA) of the WLAN 100. The BSS may be identified to users by a Service Set Identifier (SSID), as well as to other devices by a Basic Service Set Identifier (BSSID), which may be a Medium Access Control (MAC) address of the AP 102.

The AP 102 periodically broadcasts beacon frames ("beacons") including the BSSID to enable any STAs (e.g., such as one or more, or all, of the STAs 104a-104d) within wireless range of the AP 102 to associate or re-associate with the AP 102 to establish a respective communication link 108a-108d (e.g., hereinafter also referred to as a "Wi-Fi link"). For example, the first STA 104a can establish a respective communication link 108a with the AP 102, the second STA 104b can establish a respective communication link 108b with the AP 102, the third STA 104c can establish a respective communication link 108c with the AP 102, the fourth STA 104d can establish a respective communication link 108d with the AP 102, etc. The STAs 104a-104d may additionally use the beacon frames broadcast by AP 102 to maintain the respective communication link 108a-108d with the AP 102. For example, the beacons can include an identification of a primary channel used by the respective AP 102 as well as a timing synchronization function for establishing or maintaining timing synchronization with the AP 102. The AP 102 may provide access to external networks to various STAs in the WLAN via respective communication links 108.

To establish the communication links 108a-108d with an AP 102, each of the respective STAs 104a-104d can perform passive or active scanning operations ("scans") on frequency channels in one or more frequency bands. For example, to perform passive scanning, each of the STAs 104a-104d listens for beacons that are transmitted by the AP 102 at a periodic time interval referred to as the Target Beacon Transmission Time (TBTT). The TBTT can be measured in Time Units (TUs). In some examples, one TU may be equal to 1024 microseconds (μs). In some examples, the TBTT can have a default value of 102.4 milliseconds (ms). To perform active scanning, each of the STAs 104a-104d can generate and sequentially transmit probe requests on each channel to be scanned and listens for probe responses from the AP 102. Each of the STAs 104a-104d may be configured to identify or select an AP 102 with which to associate (e.g., based on the scanning information obtained through the passive or active scans), and to perform authentication and association operations to establish a respective communication link 108a-108d with the selected AP 102. The AP 102 assigns an Association Identifier (AID) to each of the STAs 104a-104d at the culmination of the association operations, which the AP 102 uses to track the STAs 104a-104d.

In some cases, one or more of the STAs 104a-104d may have the opportunity to select one of many BSSs within range of the STA or to select among multiple APs 102 that together form an Extended Service Set (ESS) including multiple connected BSSs. An extended network station associated with the WLAN 100 may be connected to a wired or wireless distribution system that may allow multiple APs 102 to be connected in an ESS. In some examples, one or more of the STAs 104a-104d can be covered by more than one AP 102 and can associate with different APs 102 at different times for transmissions. After association with an AP 102, one or more of the STAs 104a-104d also may be configured to periodically scan its surroundings to find a more suitable AP with which to associate. For example, a given one of the STAs 104a-104d that is moving away from its associated AP 102 may perform a "roaming" scan to find another AP having more desirable network characteristics (e.g., such as a greater Received Signal Strength Indicator (RSSI), a reduced traffic load, etc.).

In some cases, the STAs 104a-104d may form networks without APs 102 or other equipment other than the STAs 104a-104d themselves. One example of such a network is an ad hoc network. Some examples of an ad hoc network are mesh networks and peer-to-peer (P2P) networks. In some cases, ad hoc networks may be implemented within a larger wireless network In such implementations, while the STAs 104a-104d may be capable of communicating with each other through the AP 102 using the respective communication links 108a-108d, the STAs 104a-104d, the STAs may also communicate directly with each other using direct wireless links 110. In some examples, two STAs may communicate via a direct communication link 110 regardless of whether both STAs 104 are associated with and served by the same AP 102. In such an ad hoc system, one or more of the STAs 104a-104d may assume the role filled by the AP 102 in a BSS. Such a STA may be referred to as a Group Owner (GO) and may coordinate transmissions within the ad hoc network. Examples of direct wireless links 110 can include one or more of Wi-Fi Direct connections, connections established by using a Wi-Fi Tunneled Direct Link Setup (TDLS) link, and other P2P group connections, etc.

The APs 102 and STAs 104a-104d may function and communicate using the respective communication links 108a-108d according to at least one of the IEEE 802.11 wireless communication protocol standards. These standards define the WLAN radio and baseband protocols for the physical (PHY) and Medium Access Control (MAC) layers. For example, the APs 102 and STAs 104a-104d transmit and receive wireless communications to and from one another in the form of PHY Protocol Data Units (PPDUs) or Physical Layer Convergence Protocol (PLCP) PDUs. The APs 102 and STAs 104a-104d in the WLAN 100 may transmit PPDUs over a license or unlicensed spectrum, which may be a portion of spectrum that includes frequency bands traditionally used by Wi-Fi technology, such as the 2.4 GHz band, the 5 GHz band, the 60 GHz band, the 3.6 GHz band, and the sub-1 GHz band. Some implementations of the APs

102 and STAs 104a-104d described herein also may communicate in other frequency bands, such as the 6 GHz band, which may support both licensed and unlicensed communications. The APs 102 and STAs 104a-104d also can be configured to communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11 standards and specifications may be transmitted over frequency bands that are divided into multiple 20 MHz channels. In such examples, the PPDUs are transmitted over a physical channel having a minimum bandwidth of 20 MHz, although other channel bandwidths are also possible. In some cases, a larger bandwidth channel can be formed using channel bonding, which bonds together multiple channels each of the minimum bandwidth.

Each PPDU is a composite structure that includes a PHY preamble and a payload in the form of a PHY Service Data Unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is based on the particular IEEE 802.11 protocol to be used to transmit the payload.

FIG. 2A is a high-level block diagram of an exemplary wireless communication device 200 that can be used to implement a STA or an AP, in some examples. The wireless communication device 200 can include a MAC layer and a PHY layer in accordance with one or more of the IEEE 802.11 standards.

The wireless communication device 200 includes a Radio Frequency (RF) transmitter module 202, an RF receiver module 204, an antenna unit 206, one or more memory banks 208, input and output interfaces 210, and communication bus 212. The RF transmitter module 202 and the RF receiver module 204 include a modem (modulator-demodulator device), which transmits data by modulating one or more carrier wave signals to encode digital information, as well as receives data by demodulating the signal to recreate the original digital information. As illustrated, the wireless communication device 200 further includes a MAC processor 214, a PHY processor 216 and a HOST processor 218. These processors can be any type of Integrated Circuit (IC) including a general processing unit, an Application Specific Integrated Circuit (ASIC) or Reduced Instruction Set Computer-Five (RISC-V) based ICs, amongst others.

The memory 208 can be used to store software and/or computer-readable instructions, including software or instructions that can be used to implement at least some functions of the MAC layer. For example, each processor included in the wireless communication device 200 (e.g., MAC processor 214, PHY processor 216, HOST processor 218, etc.) executes respective software to implement the functions of the respective communication/application layer.

The PHY processor 216 includes a transmitting signal processing unit and a receiving signal processing unit (not shown) and can be used to manage the interface with the Wireless Medium (WM). The PHY processor 216 operates on PPDUs by exchanging digital samples with the radio module which includes the RF transmitter 202, the RF receiver 204, analog-to-digital converters, and digital filters.

The MAC processor 214 executes MAC level instructions and manages the interface between the application software and the WM, through the PHY processor 216. The MAC processor 214 is responsible for coordinating access to the WM so that the Access Point (AP) and STAs in range can communicate effectively. The MAC processor 214 adds header and tail bytes to units of data provided by the higher levels and sends them to the PHY layer for transmission. The reverse happens when receiving data from the PHY layer. If a frame is received in error, the MAC processor 214 manages the retransmission of the frame.

The HOST processor 218 interfaces with the MAC layer and is responsible for running higher level functionalities of the wireless communication device.

The PHY processor 216, the MAC processor 214, the HOST processor 218, the peripheral bus 220, the memories 208, and the input/output interfaces 210 communicate with each other via the peripheral bus 212. The peripheral bus 220 connects to a number of peripherals that support core functions of the wireless communication device 200, including timers, interrupts, radio/filters/system registers, counters, UART, GPIO interfaces, among others. The memory 208 may further store an operating system and applications. In some examples, the memory may store recorded information about captured frames and packets. The input/output interface unit 210 allows for exchange of information with a user of the wireless communication device. The antenna unit 206 can include a single antenna and/or can include or multiple antennas. For example, multiple antennas can be used to implement Multiple Input Multiple Output (MIMO) techniques, among others.

Figure 2B:
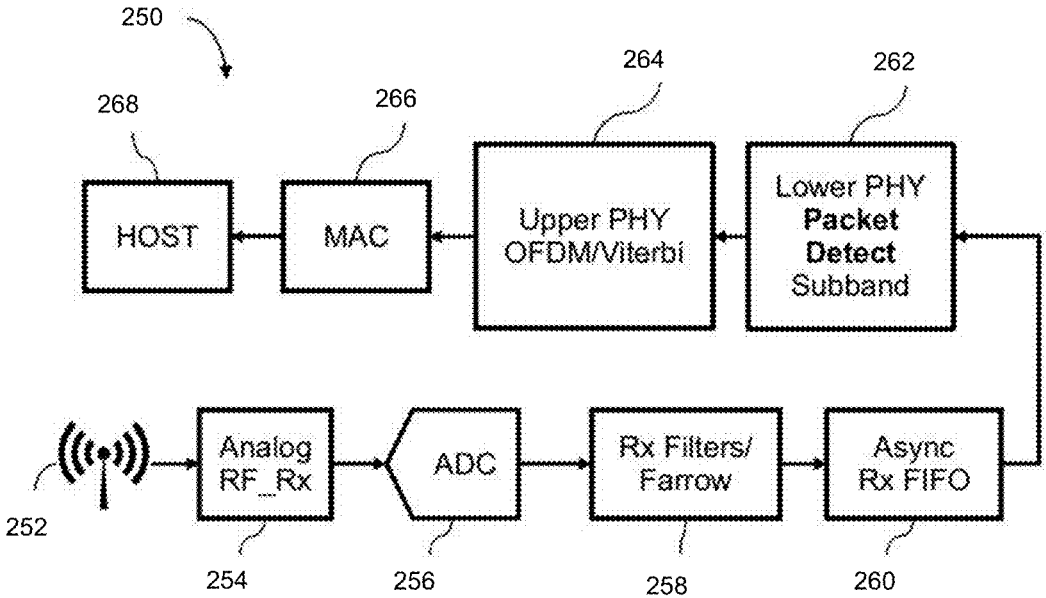
FIG. 2B is a schematic block diagram of the receiver data flow architecture of the wireless communication device of FIG. 2A, in accordance with some embodiments.

FIG. 2B illustrates a schematic block diagram of a receiver data flow architecture 250 that can be used to receive Wi-Fi packets over the network. In one illustrative example, the receiver data flow architecture 250 illustrated in FIG. 2B can correspond to or otherwise be associated with the wireless communication device 200 illustrated in FIG. 2A. Radio signals are received over the WM and translated into electrical signals by the receiving antenna 252 (e.g., which can be the same as or similar to antenna 206). The received signal is conditioned using a series of analog filters 254 (e.g., depicted as analog RF receive (Rx) filters) before being converted into a digital signal equivalent using an Analog-to-Digital Converter (ADC) 256. The sampled signal output of ADC 256 is conditioned again using a filter bank 258, which can include one or more digital RF filters and/or a farrow, before the samples are collected in an asynchronous receiving First-In-First-Out (FIFO) data structure 260.

Samples in FIFO structure 260 can be accessed by a plurality of modules. For example, samples can be accessed by a packet detect module and a sub-band module, both of which may be included in the lower-level PHY portion 262 depicted in FIG. 2B. In some embodiments, the lower-level PHY portion 262 is itself included in the PHY processor 216 illustrated in FIG. 2A.

The packet detect module included in the lower-level PHY portion 262 can include hardware and/or implement algorithms that can be used to analyze the initial sections of the PPDU in the time domain. Based on the analysis, the packet detect module can be used to recognize a received frame and synchronize frequency and timing of the wireless communication device with the packet being received. The sub-band module included in the lower-level PHY portion 262 can include hardware and/or implement algorithms that can be used to detect which subchannel in the allocated frequency band is being used for the packet being received.

Once a packet is detected and the relevant subchannel is established, samples can be forwarded to an upper-level PHY portion 264. The upper-level PHY portion 264 can be included in the PHY processor 216 illustrated in FIG. 2A. In some aspects, upper-level PHY portion 264 can be used to process and decode Orthogonal Division Multiplexing (OFDM) symbols (e.g., with the support of a coprocessor module) to reconstruct the full PPDU. The reconstructed PPDU is output by the upper-level PHY portion 264 and subsequently processed by the MAC layer processor 266. The MAC layer processor 266 can be used to extract the data payload from the PPDU and provide the relevant information to the HOST layer 268 for consumption.

In some examples, the MAC layer processor 266 illustrated in FIG. 2B can be the same as or similar to the MAC processor 214 illustrated in FIG. 2A. In some cases, the HOST layer 268 illustrated in FIG. 2B can include or otherwise can be the same as or similar to the HOST processor 218 illustrated in FIG. 2A.

Figure 2C:
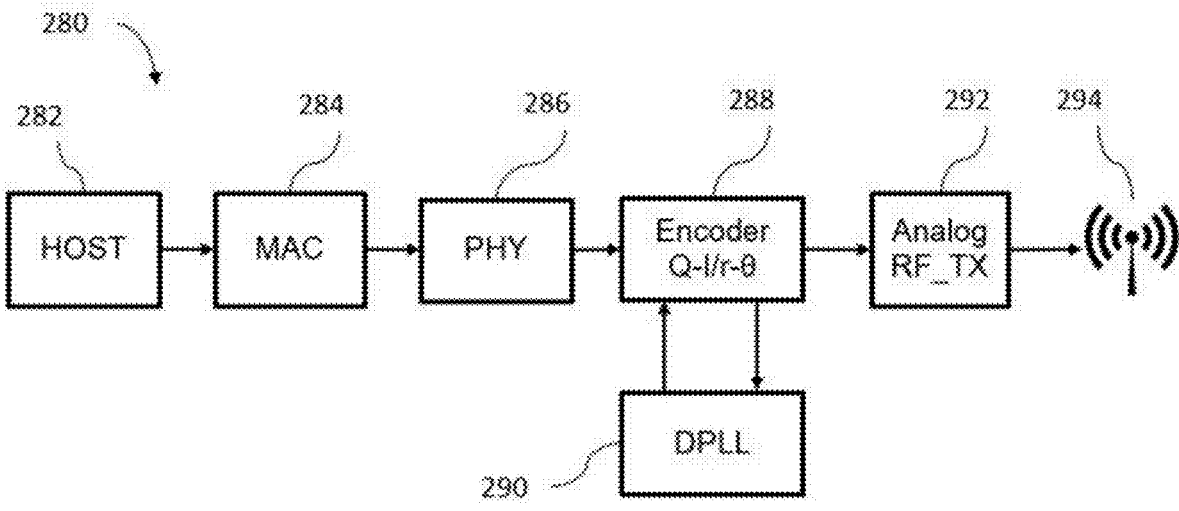
FIG. 2C is a schematic block diagram of a transmitter data flow architecture that can be used to transmit Radio Frequency (RF) signals over a wireless medium, in accordance with some embodiments.

FIG. 2C is a schematic block diagram of a transmitter data flow architecture 280 that can be used to transmit RF signals over a wireless medium, in accordance with some examples. More particularly, FIG. 2C illustrates a simplified schematic block diagram of a transmitter data flow architecture 280 used for transmitting radio signals over a WM. Data can be generated from a HOST or APP module 282 and packaged in a MAC level Protocol Data Unit (MPDU) to be routed over the wireless network by the MAC management module 284. The PHY module 286 interfaces with the WM and compiles a PPDU by adding a PHY preamble and the tail to the MPDU. Usually a Modulation Coding Scheme (MCS) for transmission of the packet over the medium is established using a rate control algorithm by the MAC module 284 or the PHY module 286. The modulation scheme selected can define the modulation technique to be used to transmit the data on the WM and the coding rate. Based on the modulation scheme selected, for example Quadrature Amplitude Modulation (QAM) 64, the PPDU is modulated to be transmitted on the WM. The encoder module 288 generates signals corresponding to points of QAM constellation symbols (groups of bits of the PPDU) which can be encoded using polar (r-θ) or cartesian (Q-I) coordinates. The modulation is done by linking the encoder module 288 to a Digital Phase Lock Loop (DPLL) 290. The modulated signals may be filtered by analog filters 292 and transmitted using a transmitting antenna 294.

As noted previously, the systems and techniques described herein can be used to provide power amplifier gain error compensation, for instance to perform signal compensation to digitally correct a gain characteristic of a Digital Power Amplifier (DPA). In some aspects, the DPA may be included within and/or implemented by a wireless device transmitting Radio Frequency (RF) signal on a Wireless Medium (WM), etc.). In some cases, the DPA can be a switched-capacitor power amplifier (ScPa). As will be described in greater detail below with respect to FIGS. 3-18, in some aspects, to implement power amplifier gain error compensation and/or to perform signal compensation to digitally correct a DPA gain characteristic, the DPA can include or implement one or more pre-distortion modules that are used to apply a configured distortion to an input signal or input signal component provided to each pre-distortion module of the DPA.

Figure 3:
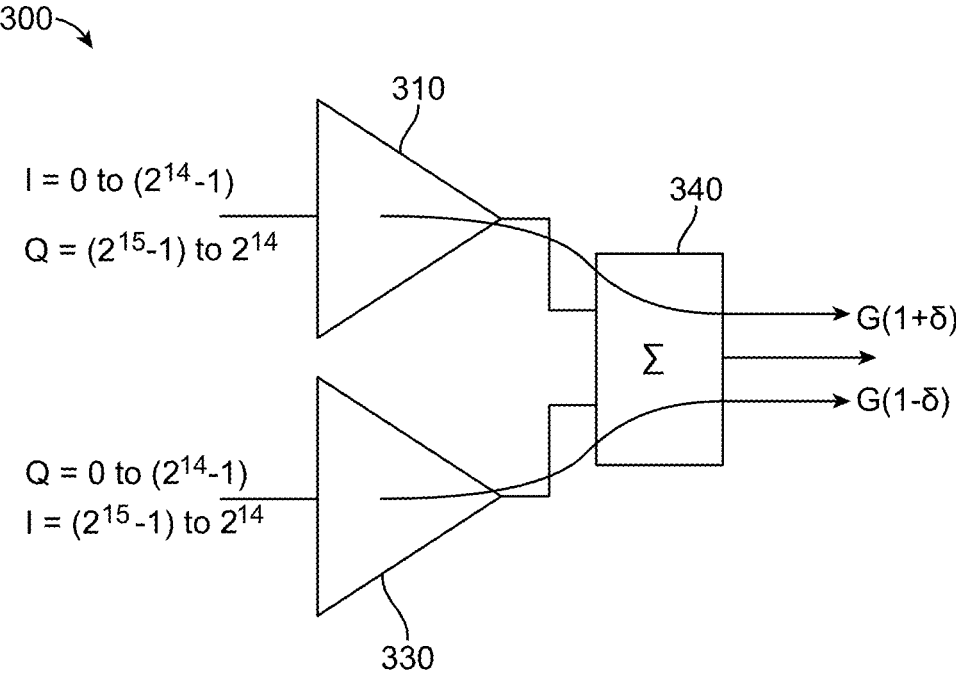
FIG. 3 is a diagram illustrating an example of a Digital Power Amplifier (DPA) comprising a Switched-capacitor Power amplifier (ScPa) including a first section corresponding to in-phase (I) signal components and a second section corresponding to quadrature-phase (Q) signal components, in accordance with some embodiments.

As also noted above, DPAs may employ various techniques to optimize efficiency and/or power consumption, although such optimizations also introduce distortion for existing DPA implementations, particularly when the input amplitude codes driving the DAC (e.g., the DAC included or integrated within the DPA) are large. For example, one technique that may be used to optimize the efficiency of a DPA is based on driving only one section of the DPA for low-amplitude signals, and driving two sections of the DPA (e.g., whose outputs are added together) for high amplitude signals. An embodiment of the DPA is a Switched capacitor Power Amplifier (ScPa) consisting of N sections, where N is a positive integer. FIG. 3 is a diagram illustrating an example of a ScPa architecture 300 for digital power amplification, with N=2 sections. For example, the ScPa 300 includes a first section 310 corresponding to in-phase (I) signal components and a second section 330 corresponding to quadrature-phase (Q) signal components. In the example of FIG. 3 (and other embodiments of a DPA implementing this technique), both the I and Q components are represented by 15-bit amplitude codes. For example, in a 16-bit Digital to Analog Converter (DAC), one bit is used to represent the sign of the sample while 15 bits are used to represent the amplitude of the sample.

In FIG. 3, the first section 310 of the DPA (e.g., ScPa 300) has elements controlled by the amplitude code of the I component when the amplitude code of the I component is between 0 to $(2^{14}-1)$, and has elements controlled by the amplitude code of the Q component when the amplitude code of the Q component is between $2^{14}$ and $(2^{15}-1)$. The second section 330 has elements controlled by the amplitude code of the Q component when the amplitude code of the Q component is between 0 and $(2^{14}-1)$, and has elements controlled by the amplitude code of the I component when the amplitude code of the I component is between $2^{14}$ and $(2^{15}-1)$. Correct operation assumes that the gain to the combined output 340 from both of the DPA sections 310, 330 is the same. However, in reality, there will be a small difference in the gain between first section 310 and second section 330, which introduces undesirable distortion(s) to the DPA combined output 340. For example, the gain to the output 340 from the first section 310 may be G(1+δ) whereas the gain to the output 340 from the second section 330 may be G(1−δ). In another example, the gain to the output 340 from the first section 310 may be G(1+δ₁) and the gain to the output 340 from the second section 330 may be G(1−δ₂), etc.

Figure 4:
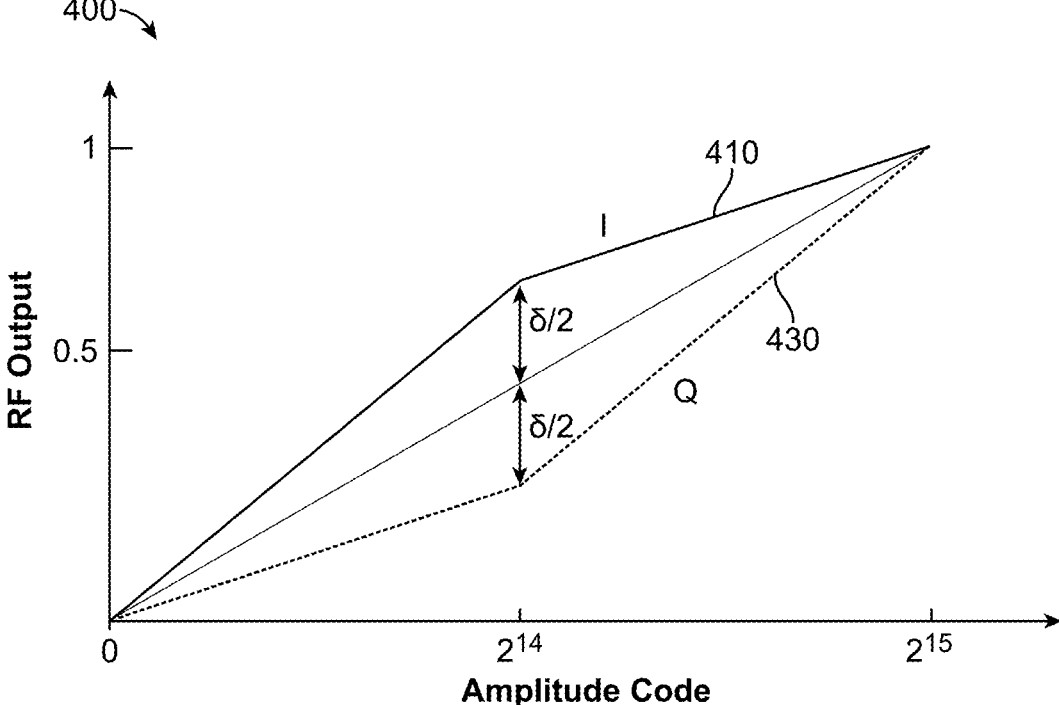
FIG. 4 is a graph illustrating an example of gain transfer characteristics of a DPA for the I and Q components of the DPA radio frequency (RF) output, in accordance with some embodiments.

FIG. 4 is a graph illustrating an example of the gain transfer characteristics 400 of a DPA (e.g., such as the DPA 300 of FIG. 3, etc.) for the I component(s) 410 and the Q components 430. In the example of FIG. 4, the horizontal axis represents an amplitude code and the vertical axis represents a corresponding RF output level. In an ideal case (e.g., between the I component 410 and the Q component 430 of the graph 400 of the example DPA gain transfer characteristics), amplitude code $2^{14}$ maps to an RF output level of 0.5. However, the real RF output for the amplitude code $2^{14}$ is offset or displaced by an amount δ/2 away from the ideal output for both the I component 410 (e.g., +δ/2 away from the ideal RF output level of 0.5) and the Q component 430 (e.g., −δ/2 away from the ideal RF output level of 0.5). In the example gain transfer characteristics graph 400, the maximum gain characteristic deviation occurs at the amplitude code $2^{14}$, with a total deviation of δ. It is noted that the vertical scales of FIG. 4 are exaggerated to show the distortion to the DPA output, in reality, the difference between the two gain paths 410, 430 will be a fraction of a decibel (dB).

In some aspects, the DPA gain transfer characteristic (e.g., such as the DPA gain transfer characteristics 400 of FIG. 4) can be formulated mathematically using the following equations:

$$yI = xI\frac{gI}{2^{15}}, 0 \le xI < 2^{14} \qquad \text{Eq. (1)}$$

$$yI = xI\frac{1 - 0.5gI}{2^{14}} + gI - 1, 2^{14} \le xI < 2^{15} - 1 \qquad \text{Eq. (2)}$$

$$yQ = xQ\frac{gQ}{2^{15}}, 0 \le xQ < 2^{14} \qquad \text{Eq. (3)}$$

$$yQ = xQ\frac{1 - 0.5gQ}{2^{14}} + gQ - 1, 2^{14} \le xQ < 2^{15} - 1 \qquad \text{Eq. (4)}$$

In the example of Eqs. (1)-(4), the terms xI and x $Q$ represent the input amplitude codes corresponding to the in-phase and quadrature phase arms, respectively. The terms gI and g $Q$ represent the slopes of the initial portions of the DPA gain transfer functions, again for the in-phase and quadrature phase arms, respectively. The term gI=1+δ and g $Q$=1−δ.

Some embodiments of the disclosed gain error compensation method for correcting the gain characteristic of the DPA can be implemented in a digital domain. For example, a pre-distortion module can be implemented in the digital baseband of a wireless communication device to generate pre-distorted baseband samples for input to the DPA, such that the processed or final output of the DPA comes out undistorted (e.g., the pre-distortion is configured or otherwise applied to cause the non-linear gain effect applied by the DPA processing to be canceled out).

In some aspects, the gain characteristics of the DPA for both the I and Q components can be modeled to be piecewise linear, thus the pre-distortion characteristics of the pre-distortion module are also piecewise linear in nature as shown in FIG. 5. In particular, FIG. 5 is a graph illustrating an example of pre-distortion transfer characteristics 500 of an embodiment of the pre-distortion module for pre-compensating the I and Q components. The graph 500 of pre-distortion transfer characteristics can also be referred to as a graph of DPA gain pre-distortion transfer characteristics. The graph 500 includes a representation 520 of the ideal (e.g., zero distortion) case, a representation 510 of the pre-compensation characteristics on the I component, and a representation 530 of the pre-compensation characteristic on the Q component. The horizontal axis of the graph 500 in FIG. 5 corresponds to the input amplitude code for the I or Q component (e.g., which can be a 15-bit input amplitude code, etc.). The vertical axis of the graph 500 corresponds to the output amplitude code after processing the input amplitude code by the pre-distortion module.

In some embodiments, the disclosed power amplifier gain error compensation can be implemented using a pre-distortion module to perform pre-distortion (e.g., also referred to as pre-compensation) of the inputs to the DPA, such that the pre-distortion and the DPA non-linear gain effect of the subsequent DPA processing are canceled out. In some aspects, the pre-distortion module can be positioned in the transmitter to be close to, nearby to, adjacent to, etc., the Digital to Analog Converter (DAC) included within or otherwise associated with the DPA. For example, the pre-distortion module may be located upstream of the DAC, with the gain error compensation performance improving for closer positioning of the pre-distortion module relative to the DAC.

Figure 6:
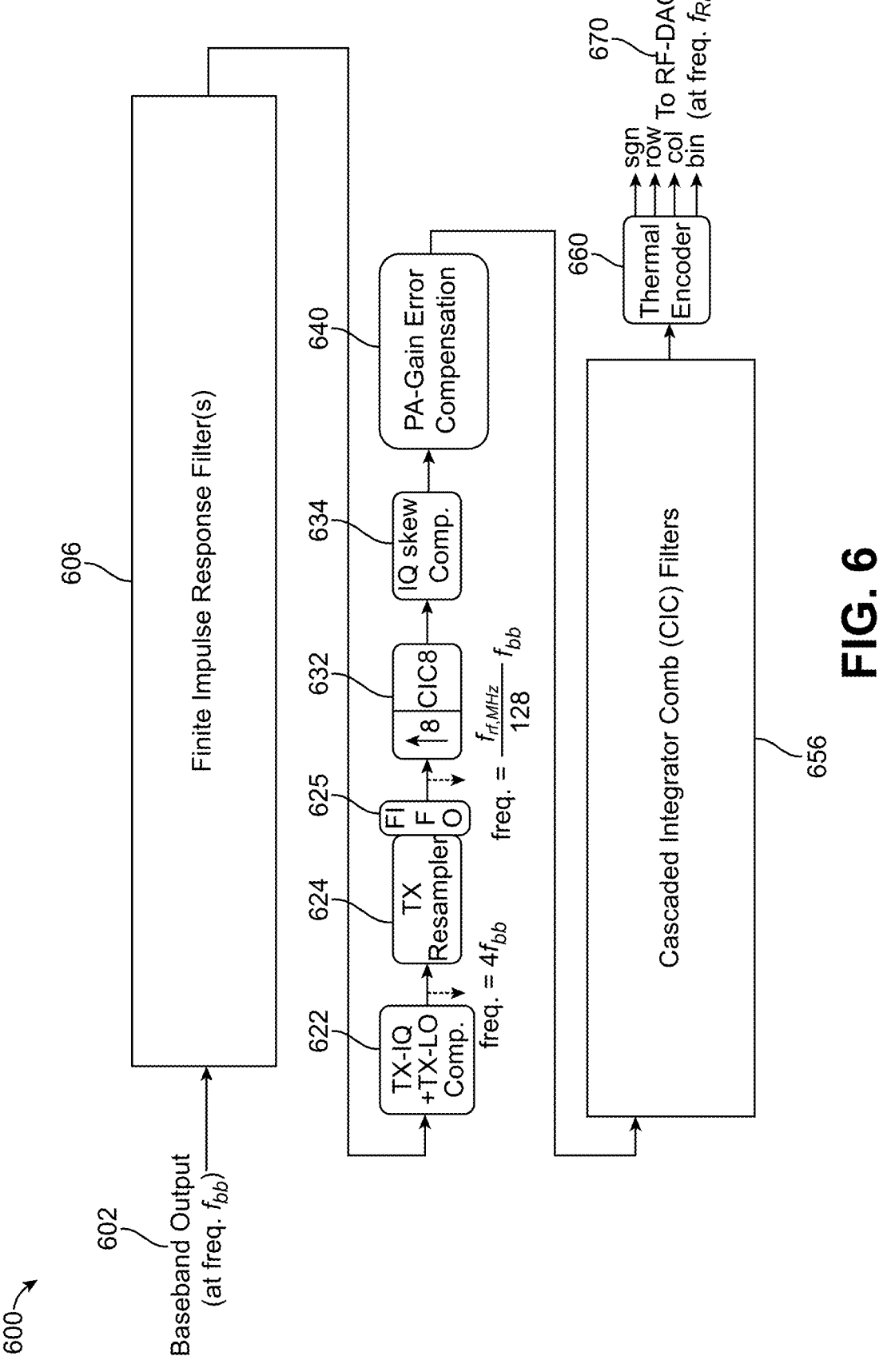
FIG. 6 is a diagram illustrating an example of a direct RF transmitter architecture including a pre-distortion module for PA gain error compensation, in accordance with some embodiments.

FIG. 6 is a diagram illustrating an example of a direct RF transmitter architecture 600 that includes a pre-distortion module 640 (e.g., also referred to interchangeably herein as a PA-gain error compensation module) for PA gain error compensation in a direct RF transmitter architecture. For example, the direct RF transmitter 600 can receive a baseband output 602, where the baseband output 602 is associated with a baseband frequency $f_{bb}$.

Between the input (e.g., the baseband 602) and the output (e.g., to the RF-DAC 670) of the direct RF transmitter architecture 600, the baseband 602 can be processed by one or multiple Finite Impulse Response (FIR) filters 606 followed by multiple Cascaded Integrator Comb (CIC) filters 656, to thereby provide baseband upsampling processing to upsample the baseband output 602 from a baseband frequency (e.g., $f_{bb}$) to a radio frequency (e.g., $f_{RF}$).

The output of the FIR filter bank 606 can be passed to a TX-IQ and TX-LO compensation module 622, which may be configured to perform compensation for in-phase and quadrature (e.g., IQ) imbalance, as well as for Local Oscillator (LO) imperfections, etc., to thereby correct phase and/or amplitude mismatches that may be present between the I and Q components of the input signal(s) to the TX-IQ and TX-LO compensation module 622.

Downstream from the TX-IQ and TX-LO compensation module 622, a First In First Out (FIFO) memory block 625 can be associated with a Tx TX resampler block 624. The FIFO memory block 625 can be configured as a buffer and may be placed in between adjacent clock domains.

In some embodiments, the PA-gain error compensation module 640 can be located after (e.g., downstream of, in the signal processing pipeline or signal processing flow implemented by the direct RF transmitter architecture 600) a CIC filter block 632 and an IQ skew compensation module 634. In some examples, the CIC filter block 632 can be implemented as a CIC8 configured to perform upsampling of the frequency by a factor of eight. The IQ skew compensation module 634 can be used to compensate imbalance between the I and Q components of the signal(s) provided as input to the IQ skew compensation module 634. For example, the IQ skew compensation module 634 can be used to compensate for any skew or delay mismatch that may be present between the I and Q signal paths, such that the output from the IQ skew compensation module 634 has aligned the timing of the I and Q components.

The PA-gain error compensation module 640 can generate as output one or more I and Q amplitude codes. The I and Q amplitude codes output from the PA-gain error compensation module 640 can be processed by a chain of CIC filters for extra upsampling (e.g., a chain of CIC filters within the plurality or set of CIC filters 656). In some aspects, one or more of the CIC filters, or each CIC filter, may be bypassed according to the configured mode.

The output from the chain of CIC filters 656 can be provided as input to a thermal encoder 660, which in some embodiments can represent the last stage of the direct RF transmitter architecture 600 that is located before the DAC. For instance, the output 670 of the thermal encoder 660 may be provided directly to the RF-DAC as input. In some examples, the thermal encoder 660 can be configured to perform thermal encoding where each I and Q rail is encoded into four signals: sign (e.g., "sgn"), row (e.g., "row"), column (e.g., "col"), and bin (e.g., "bin"). The thermal encoder 660 can be a digital thermal encoder. In some embodiments, the output of the digital thermal encoder (e.g., the output 670, at the frequency $f_{RF}$) can be fed to a high speed RF DAC operating at the radio frequency $f_{RF}$.

In some embodiments, the PA-gain error compensation module 640 can be a pre-distortion module with a piecewise linear transfer characteristic, which can be expressed mathematically as:

$$zI = \frac{xI}{gI}, 0 \le xI < gI \cdot 2^{14} \qquad \text{Eq. (5)}$$

$$zI = \frac{xI - gI \cdot 2^{14}}{2 - gI} + 2^{14}, gI \cdot 2^{14} \le xI < 2^{15} - 1 \qquad \text{Eq. (6)}$$

$$zQ = \frac{xQ}{gQ}, 0 \le xQ < gQ \cdot 2^{14} \qquad \text{Eq. (7)}$$

$$zQ = \frac{xQ - gQ \cdot 2^{14}}{2 - gQ} + 2^{14}, gQ \cdot 2^{14} \le xQ < 2^{15} - 1 \qquad \text{Eq. (8)}$$

The terms xI and $xQ$ represent the input amplitude codes corresponding to the in-phase and quadrature phase arms, respectively, of the pre-distortion module 640. The terms zI and $zQ$ represent the output amplitude codes corresponding to the in-phase and quadrature-phase arms, respectively, of the pre-distortion module 640.

Figure 7A:
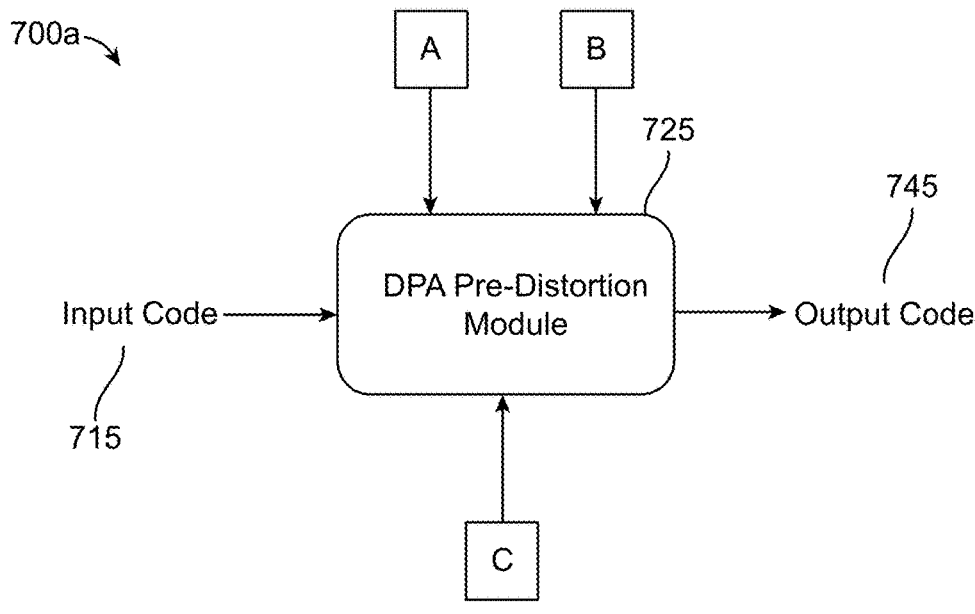
FIG. 7A is a diagram illustrating an example of a DPA pre-distortion module configured using a fixed point implementation with corresponding parameter sets, in accordance with some embodiments.

For example, FIG. 7A is a diagram illustrating an example of pre-distortion processing 700a, which can be implemented by a pre-distortion module 725 configured using a fixed-point implementation with corresponding parameter sets A, B, C, etc. In some aspects, the pre-distortion module 725 may be the same as or similar to the pre-distortion module 640 of FIG. 6. In one illustrative example, the terms xI and $xQ$ of Eqs. (5)-(8), above, can correspond to the I component and Q component (respectively) of the input amplitude codes 715 provided to the pre-distortion module 725. The terms zI and $ZQ$ of Eqs. (5)-(8) can correspond to the I component and Q component (respectively) of the output amplitude codes 745 generated by the pre-distortion module 725.

In some embodiments, a digital pre-distortion module can be realized by a fixed-point implementation with six sets of parameters:

$$\frac{1}{gI}, \frac{1}{2 - gI}, gI \cdot 2^{14}, \frac{1}{gQ}, \frac{1}{2 - gQ}, gQ \cdot 2^{14}.$$

Figure 7B:
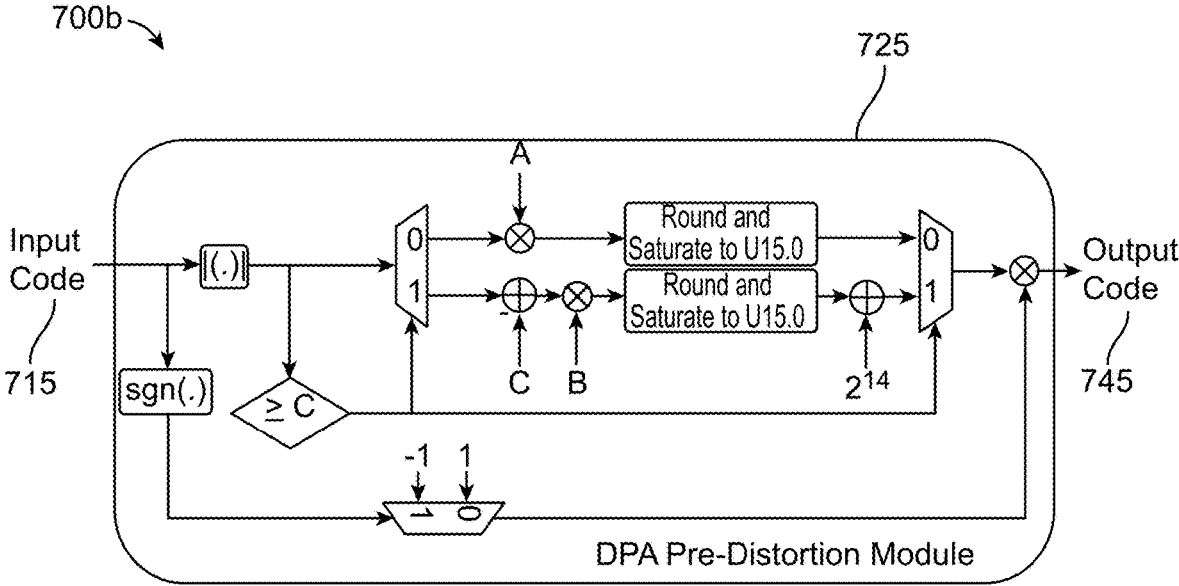
FIG. 7B is a diagram illustrating an example architecture of the DPA pre-distortion module of FIG. 7A, in accordance with some embodiments.

These six sets of parameters can correspond to the various terms and/or expressions utilized within Eqs. (5)-(8), as provided above. In some examples, the six parameter sets can be used to implement the pre-distortion module 725 of FIG. 7A and FIG. 7B (e.g., where FIG. 7B is a diagram illustrating an example architecture 700b that may be used for the pre-distortion module 725 of FIG. 7A, in accordance with some examples). For instance, the examples of FIG. 7A and FIG. 7B show a basic pre-distortion module sub-block 725, where A is equal to 1/g, B is equal to $$\frac{1}{2 - g},$$

and C is equal to $g \cdot 2^{14}$, with the term g being a configured parameter.

Figure 7C:
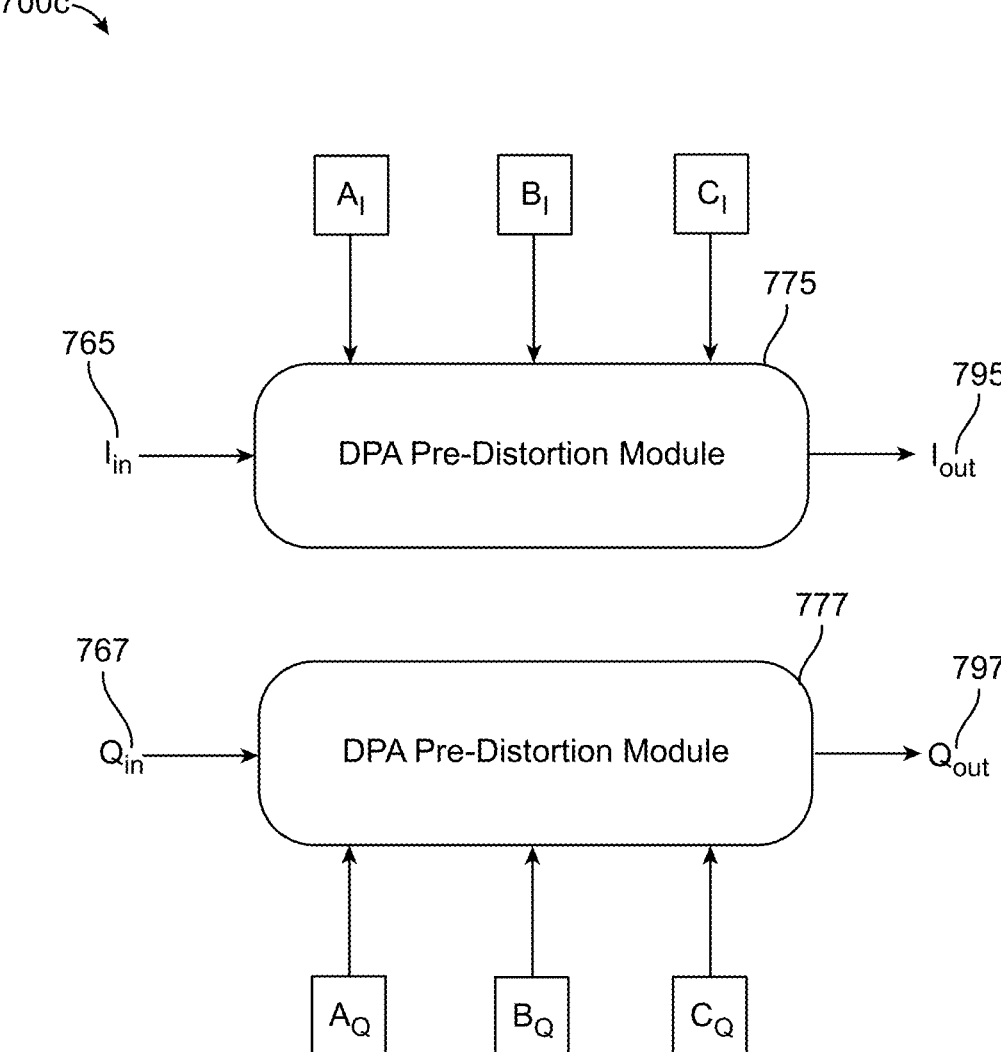
FIG. 7C is a diagram illustrating a pre-distortion module comprising a first DPA pre-distortion block for pre-distorting an I signal component arm and a second DPA pre-distortion block for pre-distorting a Q signal component arm before feeding the amplitude codes to a DPA, in accordance with some embodiments.

The example pre-distortion module 725 of FIGS. 7A and 7B corresponds to an example where the in-phase (I) and quadrature-phase (Q) arms are provided by the same pre-distortion module sub-block(s). In another example, separate pre-distortion modules or pre-distortion sub-blocks can be provided for pre-distortion processing of the I and Q arms. For instance, FIG. 7C is a diagram illustrating a pre-distortion module 700c comprising a first DPA pre-distortion block 775 for pre-distorting an I signal component arm and a second DPA pre-distortion block 777 for pre-distorting a Q signal component arm before feeding the respective I and Q amplitude codes to a DPA, in accordance with some examples.

For example, the first pre-distortion block 775 (e.g., a first DPA pre-distortion processing module, etc.) can be configured to implement pre-distortion processing for the I signal component arm, based on using a respective set of parameters $A_1$, $B_1$, and $C_1$ to process the input I amplitude codes $I_{in}$ 765 and thereby generate as output the pre-distorted I amplitude codes Iout 795. Similarly, the second pre-distortion block 777 (e.g., a second DPA pre-distortion processing module, etc.) can be configured to implement pre-distortion processing for the Q signal component arm, based on using a respective set of parameters $A_Q$, $B_Q$, and $C_Q$ to process the input Q amplitude codes Qin 767 and thereby generate as output the pre-distorted Q amplitude codes $Q_{out}$ 797.

In some examples, simulation results demonstrate that the efficiency of multi-section DPA configurations exceeds that of the traditional single section configuration. However, gain errors between the sections of a multi-section DPA configuration may limit the Error Vector Magnitude (EVM) quite severely. For example, the EVM may be limited to approximately 41 dB for a single section DPA, but EVM becomes very poor for an 8-section DPA with gain errors. In some aspects, this limitation relating to the gain error and/or EVM performance associated with a multi-section DPA or DPA configuration can be overcome by pre-compensating the gain error in the digital domain according to embodiments of the present invention.

The gain error characteristic of an N-section DPA configuration can be modeled by an N linear section piecewise function, where N is typically a power of 2. The range of the input codes is divided into N intervals, with each interval allocated for one section of the DPA.

For example, if the range of the input code is [0 $2^{15}$−1], each port is allocated a range of cardinality equal to $$\frac{2^{15}}{N}.$$

In an embodiment of an eight section DPA, each section is allocated 4096 codes, with section 1 being allocated [0 4095]; section 2 being allocated [4096 8191]; section 3 being allocated [8192 12287]; section 4 being allocated [12288 16383]; section 5 being allocated [16384 20479]; section 6 being allocated [20480 24575]; section 7 being allocated [24576 28671]; and section 8 being allocated [28672 32757].

Figure 8:
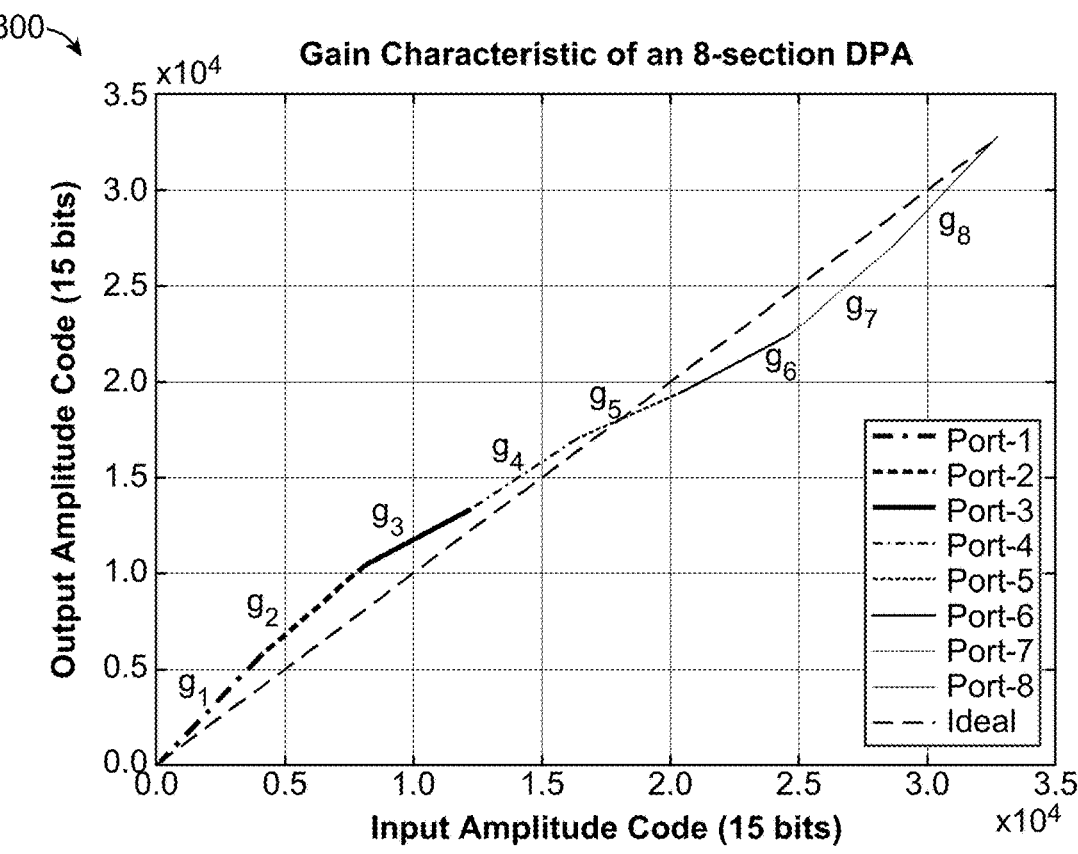
FIG. 8 is a graph illustrating an example of a generalized gain characteristic of an 8-section DPA, in accordance with some embodiments.

FIG. 8 is a graph illustrating an example of a generalized gain characteristic 800 of an 8-section DPA, in accordance with some examples. Here, the gain characteristic 800 can be seen to be piecewise linear with 8 linear sections, and each section having a different slope. The $i^{th}$ section has gain or slope $g_i$, and $$\sum_{k=1}^{8} g_k = 8.$$

In general, for an N-section DPA, $$\sum_{k=1}^{N} g_k = N.$$

The gain characteristic 800 shown in FIG. 8 can be expressed mathematically as:

$$y_1 = g_1 \cdot x; \qquad \text{Eq. (9)}$$
$$0 \le x < 4095$$

$$y_2 = g_2(x - 4095) + 4095 \cdot g_1; \qquad \text{Eq. (10)}$$
$$4096 \le x < 8191$$

$$y_3 = g_3(x - 8191) + 4096 \cdot g_2 + 4095 \cdot g_1; \qquad \text{Eq. (11)}$$
$$8192 \le x < 12287$$

$$y_4 = g_4(x - 12287) + 4096(g_2 + g_3) + 4095 \cdot g_1; \qquad \text{Eq. (12)}$$
$$12288 \le x < 16383$$

$$y_5 = g_5(x - 16383) + 4096(g_2 + g_3 + g_4) + 4095 \cdot g_1; \qquad \text{Eq. (13)}$$
$$16384 \le x < 20479$$

$$y_6 = g_6(x - 20479) + 4096(g_2 + g_3 + g_4 + g_5) + 4095 \cdot g_1; \qquad \text{Eq. (14)}$$
$$20480 \le x < 24575$$

$$y_7 = g_7(x - 24575) + 4096(g_2 + g_3 + g_4 + g_5 + g_6) + 4095 \cdot g_1; \qquad \text{Eq. (15)}$$
$$24576 \le x < 28671$$

$$y_8 = g_8(x - 28671) + 4096(g_2 + g_3 + g_4 + g_5 + g_6 + g_7) + 4095 \cdot g_1; \qquad \text{Eq. (16)}$$
$$28672 \le x < 32767$$

Here, the term $y_i$ (e.g., for i=1, 2, . . . , 8; corresponding to Eqs. (9)-(16)) represents the output magnitude code corresponding to the $i^{th}$ section and x represents the input magnitude code. The above equations can be simplified as:

$$y_1 = g_1 \cdot x; \ 0 \le x < 4095 \qquad \text{Eq. (17)}$$

$$y_i | i > 1 = g_i(x - (4096 \cdot (i-1) - 1) + 4096 \sum_{k=2}^{i-1} g_k + 4095 g_1; \qquad \text{Eq. (18)}$$
$$4096i \le x < 4096(i+1) - 1$$

This gain characteristic formulation given in Eqs. (17) and (18) corresponds to the example of the generalized gain characteristic 800 shown in FIG. 8 for an 8-section DPA, however it is noted that the gain characteristic formulation above can be easily extended to an N-section distortion characteristic for different, larger, smaller, etc., values of N other than 8.

In some examples, to correct the pathological gain characteristics of the N-section configuration in a DPA, a digital pre-distortion technique is implemented in the digital baseband according to an embodiment of the present invention. As noted previously, the pre-distortion module(s) can be configured and used to distort the baseband samples in such a way that the final output of the DPA comes out undistorted (e.g., the pre-distortion applied to the baseband samples prior to the DPA processing causes the cancellation of the pathological or inherent non-linear gain effect applied by the DPA processing).

Figure 9:
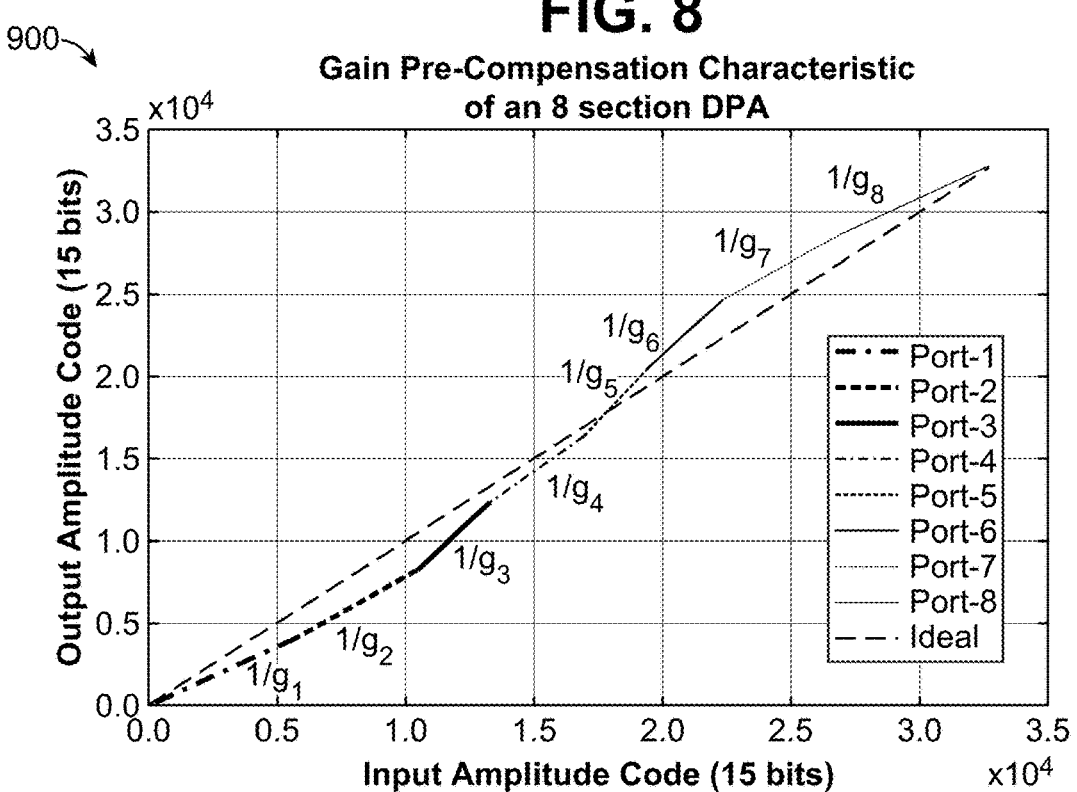
FIG. 9 is a graph illustrating an example of a corresponding gain pre-compensation characteristic (e.g., pre-distortion characteristic) for the example 8-section DPA of FIG. 8, in accordance with some embodiments.

In some aspects, the pre-distortion modules can be designed to distort the baseband samples according to corresponding pre-compensation characteristics or pre-compensation characteristics information. For example, the pre-compensation characteristic can be obtained by plotting the gain characteristic with its abscissa (x-axis) against the ordinate (y-axis). As the gain characteristic of each section is linear (e.g., such as the eight piecewise linear sections of the example gain characteristic 800 of FIG. 8, etc.), each section of the corresponding pre-distortion characteristic is also linear in nature, as shown in the example of FIG. 9 for an 8-section DPA configuration. In particular, FIG. 9 is a graph illustrating an example of a corresponding gain pre-compensation characteristic 900 (e.g., pre-distortion characteristic) for the example 8-section DPA gain characteristic 800 of FIG. 8, in accordance with some examples.

The gain pre-compensation characteristic (e.g., gain pre-compensation characteristic 900, etc.) for each piecewise linear section (e.g., of the gain characteristic 800, etc.) can be expressed mathematically as $z_i = m_i \cdot x + c_i$, with $m_i$ and $c_i$ representing the slope and intercept of the $i^{th}$ section, respectively, and with x representing the input magnitude code. The pre-compensation characteristic with a choice of 8 linear segments can be summarized as the following equations:

$$z_1 = \frac{1}{g_1}x; 0 \le x < 4095 \cdot g_1 \qquad \text{Eq. (19)}$$

$$z_i|_{i>1} = \frac{1}{g_i}x_i + 4096(i-1) - \frac{g_i + 4096\sum_{k=2}^{i-1}g_k + 4095g_i}{g_i} \qquad \text{Eq. (20)}$$

$$g_i + 4096\sum_{k=2}^{i-1}g_k + 4095 \cdot g_1 \le x \le 4096\sum_{k=2}^{i}g_k + 4095 \cdot g_1 \qquad \text{Eq. (21)}$$

For Eqs. (19)-(21), the slopes and intercepts are given by:

$$m_1 = \frac{1}{g_1}, c_1 = 0;$$

and $$m_i|_{i>1} = \frac{1}{g_i}, c_i|_{i>1} = 4096(i-1) - \frac{g_i + 4096\sum_{k=2}^{i-1}g_k + 4095 \cdot g_i}{g_i}$$

The equations above can be generalized to N segments, as described below. For example, defining $$r = \frac{32768}{N},$$

the generalized N-segment pre-compensation characteristic is:

$$z_1 = \frac{1}{g_1}x; 0 \le x < (r-1)g_1 \qquad \text{Eq. (22)}$$

$$z_i|_{i>1} = \frac{1}{g_i}x_i + r(i-1) - \frac{g_i + r\sum_{k=2}^{i-1}g_k + (r-1)g_i}{g_i} \qquad \text{Eq. (23)}$$

$$g_i + r\sum_{k=2}^{i-1}g_k + (r-1)g_1 \le x \le r\sum_{k=2}^{i}g_k + (r-1)g_1 \qquad \text{Eq. (24)}$$

For Eqs. (22)-(24), the slopes and intercepts are given by:

$$m_1 = \frac{1}{g_1}, c_1 = 0;$$

and $$m_i|_{i>1} = \frac{1}{g_i}, c_i|_{i>1} = r(i-1) - \frac{g_i + r\sum_{k=2}^{i-1}g_k + (r-1)g_i}{g_i}$$

Given the knowledge of the gains, $\{g_i\}$, the slope and intercept of each section in the piecewise linear pre-compensation characteristic (e.g., such as gain pre-compensation characteristic 900, etc.) can be computed according to the operations above. The above equations can also be generalized to various other DPA designs, implementations, configurations, architectures, etc., with arbitrarily complex gain characteristics as a result of efficiency enhancement techniques.

Figure 10:
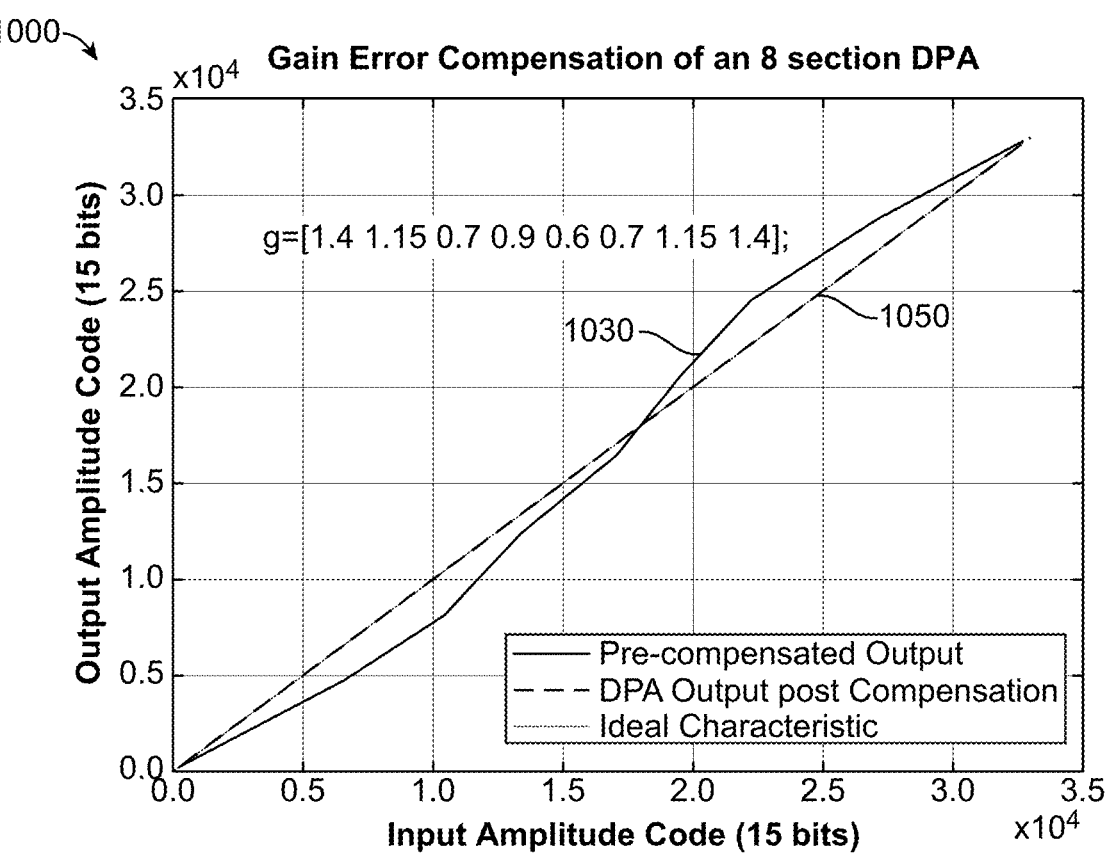
FIG. 10 is a graph illustrating an example of the gain error compensation of an 8-section DPA configured to apply a pre-distortion technique to generate a pre-compensated digital output according to the respective gain of each section of the 8-section DPA, in accordance with some embodiments.

FIG. 10 is a graph illustrating an example of gain error compensation 1000, corresponding to an embodiment of compensating the gain error of an example 8-section DPA (e.g., a DPA with an 8-section configuration) using the disclosed pre-distortion technique. In particular, by applying the disclosed pre-distortion technique to generate a pre-compensated output 1030 for each individual section of the DPA, the pre-compensated digital output 1030 is generated according to the gain of each section. The pre-compensated digital output 1030 is then processed by the same section of the DPA for which the pre-distortion information was previously derived and used in generating the pre-compensated digital output 1030. The DPA output post compensation 1050 is obtained by passing the pre-compensated digital output 1030 through the gain error model of the 8-section configuration of the DPA. As shown in the example graph of the gain error compensation 1000 of FIG. 10, by precisely estimating gains of the respective sections of a multi-section DPA, the systems and techniques make it possible to completely compensate for the gain error at the output of the DPA to thereby achieve an ideal characteristic for the DPA output 1050.

Figure 11:
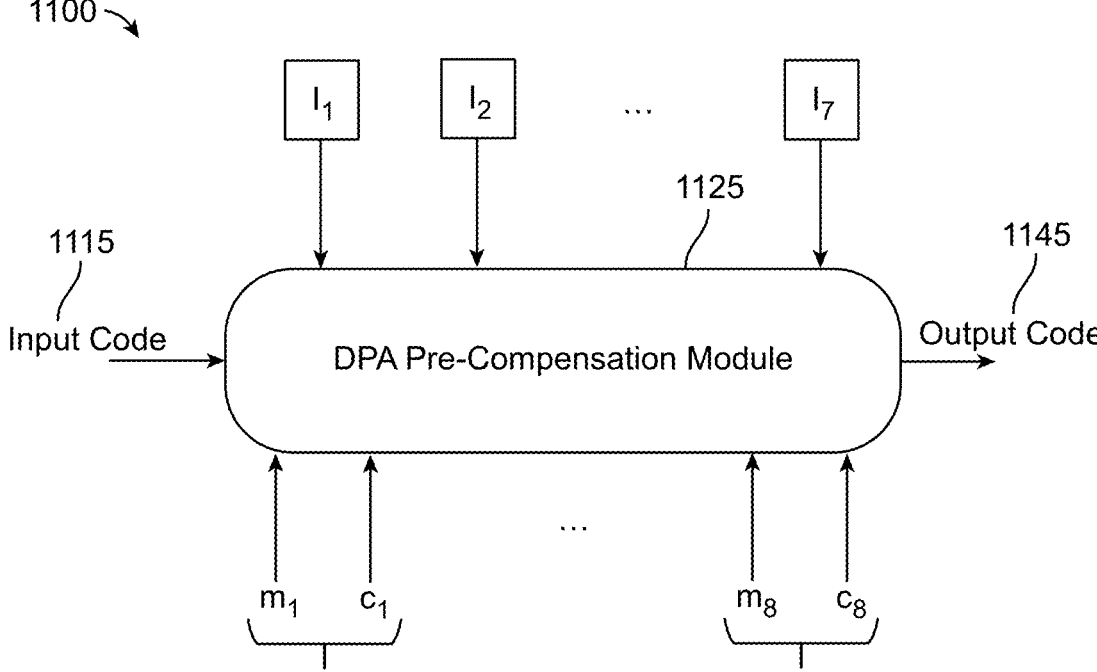
FIG. 11 is a diagram illustrating an example of a fixed point implementation of a DPA pre-compensation module for compensating the gain error of a multi-section DPA, in accordance with some embodiments.

FIG. 11 is a top level block diagram illustrating an embodiment of a fixed-point implementation 1100 of a DPA pre-compensation module 1125 that can be used for compensating the gain error of a multi-section DPA, in accordance with some examples. In some embodiments, the DPA pre-compensation module 1125 can receive input amplitude codes 1115 and generate pre-distorted output amplitude codes 1145 for gain error compensation at a DPA that receives the pre-distorted amplitude codes 1145 as input. For an 8-section DPA, the DPA pre-compensation module 1125 can be parameterized by a total of 23 parameters in order to thereby achieve the pre-compensation.

For example, the DPA pre-compensation module 1125 can utilize seven parameters indicative of the ending intervals of the piecewise sections (e.g., $I_1, I_2, \ldots, I_7$), eight parameters indicative of the respective slope for each of the eight piecewise sections (e.g., $m_1$, $m_2$, . . . , $m_8$), and eight parameters indicative of the respective intercept for each of the eight piecewise sections (e.g., $c_1$, $c_2$, . . . , $c_8$).

The values $\{I_1, I_2, \ldots, I_7\}$ represent the end intervals of the first, second, . . . , and the seventh piecewise section, respectively. In general, the end interval, $I_i$ is given by:

$$I_i = \left[ 4096 \sum_{k=2}^{i} g_k + 4095 \cdot g_1 \right], \, i = 1, 2, \ldots, 7 \qquad \text{Eq. (25)}$$

The values $\{m_i, c_i\}$, i=1, 2, . . . , 8 represent the slope and intercept (respectively) of the 8 piecewise sections, for example with $\{m_1, c_1\}$ representing the slope and intercept of the first piecewise section, with $\{m_2, c_2\}$ representing the slope and intercept of the second piecewise section, . . . , etc. In general, the slope and intercept parameters for each respective piecewise section of the DPA can be given by:

$$m_1 = \frac{1}{g_1}, \, c_1 = 0$$

$$m_i|_{i>1} = \frac{1}{g_i}, \, c_i|_{i>1} = \left[ 4096(i-1) - \frac{g_i + 4096 \sum_{k=2}^{i-1} g_k + 4095 \cdot g_1}{g_i} \right]$$

FIG. 12 is a diagram illustrating an example architecture 1200 of the DPA pre-compensation module 1125 of FIG. 11, in accordance with some examples. In some embodiments, the example architecture 1200 of FIG. 12 can represent an internal architecture of the pre-compensation module 1125 of FIG. 11.

For example, the input code 1215 of FIG. 12 can be the same as or similar to the input code 1115 of FIG. 11. The output code 1245 of FIG. 12 can be a pre-distorted output amplitude code, the same as or similar to the pre-distorted output code 1145 of FIG. 11. In one illustrative example, the architecture 1200 of the DPA pre-compensation module 1125 can include a range selection block 1262, which can be configured to implement the range selection algorithm 1264 (e.g., range selection logic) that is shown in FIG. 12.

For example, the range select block 1262 and/or the range select algorithm 1264 can be used by the pre-distortion module 1225, 1125 to select which set of slope and intercept values (e.g., which set of configured parameter values $\{m_i, c_i\}$, for i=1, 2, . . . , 8) is to be used to apply pre-distortion processing corresponding to the input code 1215.

In some embodiments, the range select block 1262 and/or the range select algorithm 1264 can be configured to compare the value of the input code 1215 (e.g., the input value x) to the piecewise section range information indicated by the seven parameter values $\{I_1, I_2, \ldots, I_7\}$ corresponding to the ending interval for the first through seventh piecewise sections. Based on comparing the value of the input code 1215 (e.g., x) to the piecewise section ending intervals (e.g., $\{I_1, I_2, \ldots, I_7\}$), the corresponding piecewise section of the DPA can be determined, and the configured parameter values $\{m_i, c_i\}$ for that piecewise section can be selected and used to configure the pre-distortion module 1225 for processing the input code 1215 x. For example, the range select block 1262 and/or the range select algorithm 1264 can be implemented based on the logic given below:

```
if (x ≤ I₁)
    mᵢ = m₁; cᵢ = c₁
elseif (I₁ < x ≤ I₂)
    mᵢ = m₂; cᵢ = c₂
elseif (I₂ < x ≤ I₃)
    mᵢ = m₃; cᵢ = c₃
elseif (I₃ < x ≤ I₄)
    mᵢ = m₄; cᵢ = c₄
elseif (I₄ < x ≤ I₅)
    mᵢ = m₅; cᵢ = c₅
elseif (I₆ < x ≤ I₇)
    mᵢ = m₇; cᵢ = c₇
else (x > I₇)
    mᵢ = m₈; cᵢ = c₈
```

In one illustrative example, simulation results demonstrated that both spectral characteristics and EVM characteristics with DPA gain error compensation performed using the disclosed pre-distortion technique are significantly improved.

In some aspects, the fixed point implementation of an N section DPA configuration will have N−1 end values (e.g., such as the example above, where an 8-section DPA configuration is parameterized by the 7 different section end values) and $\{I_1, I_2, \ldots, I_{N-1}\}$ represent the end intervals of the first, second, . . . , and the last piecewise section (respectively). Defining $$r = \frac{32768}{N},$$

the end interval, $I_i$ is given by:

$$I_i = \left[ r \sum_{k=2}^{i} g_k + (r-1)g_1 \right], \, i = 1, 2, \ldots, 7 \qquad \text{Eq. (26)}$$

The values $\{m_i, c_i\}$, i=1, 2, . . . , N represent the slope and intercept of the N piecewise sections given by:

$$m_1 = \frac{1}{g_1}, \, c_1 = 0$$

$$m_i|_{i>1} = \frac{1}{g_i}, \, c_i|_{i>1} = \left[ r(i-1) - \frac{g_i + r \sum_{k=2}^{i-1} g_k + (r-1)g_1}{g_i} \right]$$

In addition to the gain distortion described above, a DPA may also experience amplitude and/or phase distortions, and combinations thereof. For example, another non-ideal characteristic observed in a cartesian mode DPA is a Phase Modulation (PM)-Amplitude Modulation (AM) distortion inherent from the architecture of the DPA, where the PM-AM distortion (e.g., also referred to as phase-amplitude distortion) is an amplitude variation that is caused as a function of the phase of the IQ baseband sample. The DPA may also experience AM-PM distortion (e.g., also referred to as amplitude-phase distortion), which is a phase variation that is caused as a function of the amplitude of the IQ baseband sample. In some aspects, the PM-AM distortion and the AM-PM distortion can be types of crosstalk distortion between the I and Q paths of the DPA or RF transmitter architecture.

Figure 13A:
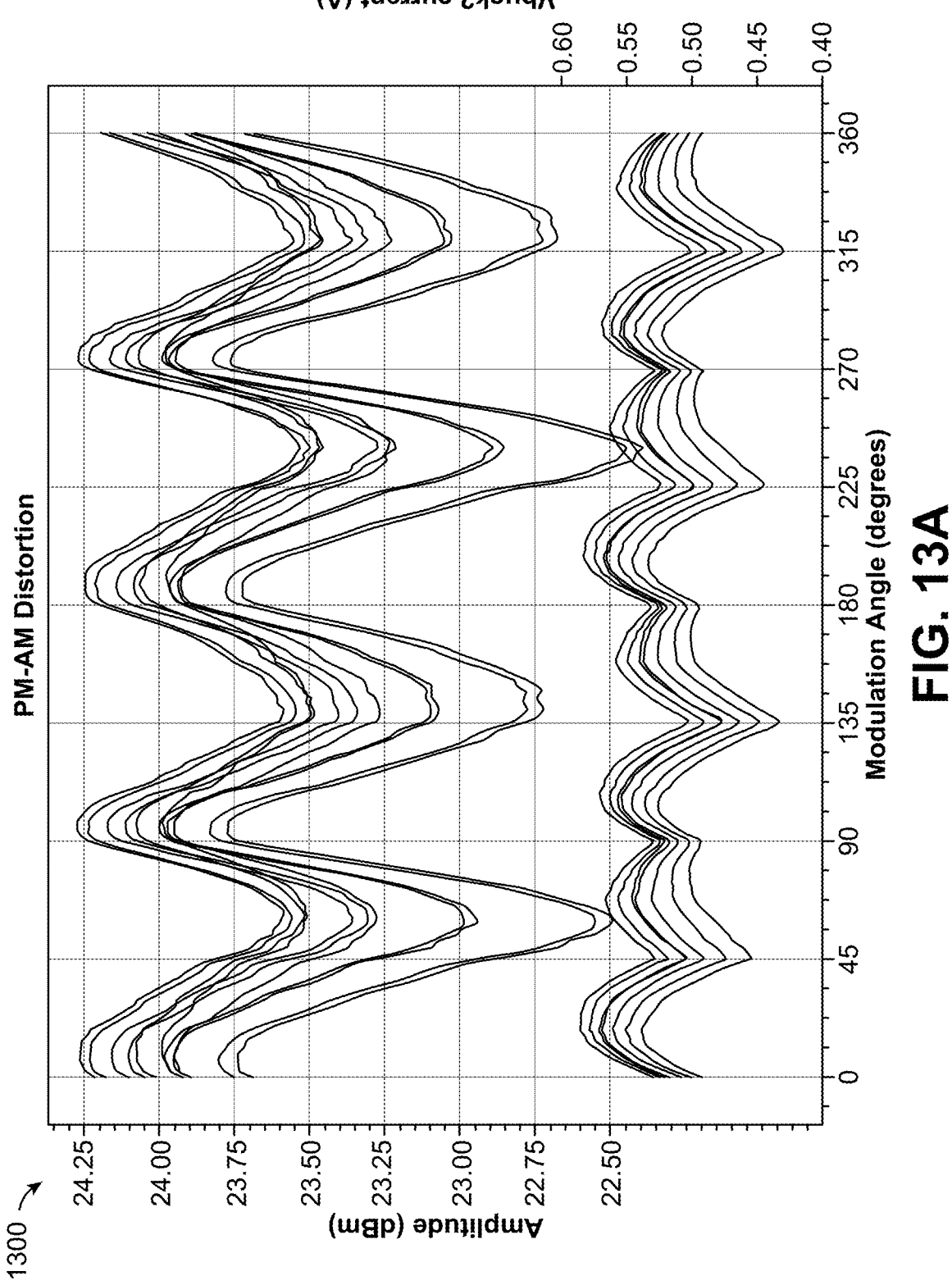
FIG. 13A is a graph illustrating an example of phase modulation-amplitude modulation (PM-AM) distortion, in accordance with some embodiments.

Typically, the number of DAC cells that are activated is a function of the phase of the incoming baseband sample, which results in different current distributions drawn from the power supply. In some cases, as the transmitter tone sweeps through the complex plane, I and Q DAC unit activation varies out of proportion to the amplitude of the output. The higher the current drawn by the DAC units, the higher the voltage drop on the power supply. It is observed that the DAC unit activation is maximized at 45-degree offsets (e.g., 45, 135, 225, and 315 degrees). The current drawn by the DAC units is therefore greatest at these 45-degree offsets, where the DAC unit activation is maximized, which in the presence of resistance on the power supply will cause a greatest voltage drop on the supply and therefore modulate the output. For example, FIG. 13A is a graph illustrating an example of phase modulation-amplitude modulation (PM-AM) distortion 1300, and illustrates the amplitude of a complex sinusoid varying as a function of the phase of IQ baseband samples.

Embodiments of the present invention can be used to digitally correct the amplitude due to the PM-AM distortion according to a phase of the IQ sample (e.g., can be used to digitally correct amplitude variations caused by PM-AM distortion, where the amplitude is affected by changes in the phase). In some embodiments, the amplitude scaling as a function of the phase is first measured or estimated, and is subsequently used to implement the amplitude corrections corresponding to PM-AM distortion compensation. For example, to measure the amplitude scaling as a function of phase, the phase axis from −180 degrees to 180 degrees can be divided into eight segments, where each segment spans 45 degrees. The negative of the amplitude distortion (in dB) with respect to the phase in each segment is approximated with a straight line, providing the slope and intercept of that segment. The slope and intercept from the amplitude distortion straight line approximation can then be used to provide the required amplitude correction (in dB) as a function of the phase of the IQ sample.

In some embodiments, the PM-AM distortion compensation may include or otherwise be performed based on converting the IQ sample into its polar representation, for example by generating amplitude and phase information using a Coordinate Rotation Digital Computer (CORDIC). The phase information of the IQ sample is used to select which of the eight segments the IQ sample belongs to, and the corresponding slope and intercept determined for the particular segment that contains the IQ sample is obtained and used to calculate a corresponding amplitude correction (in dB). The calculated amplitude correction for the IQ sample can be converted to a linear value and multiplied with the original amplitude of the IQ sample, to thereby obtain a pre-distorted amplitude (e.g., amplitude pre-distortion is implemented based on multiplying the original amplitude of the IQ sample with the linear conversion of the calculated amplitude correction). Pre-distorted phase information (e.g., for AM-PM distortion compensation) can be calculated in a same or similar manner as the pre-distorted amplitude information for the PM-AM distortion compensation described above. The pre-distorted amplitude and phase information can be used to obtain a resulting cartesian IQ sample with PM-AM and/or AM-PM pre-distortion compensation applied.

Figure 13B:
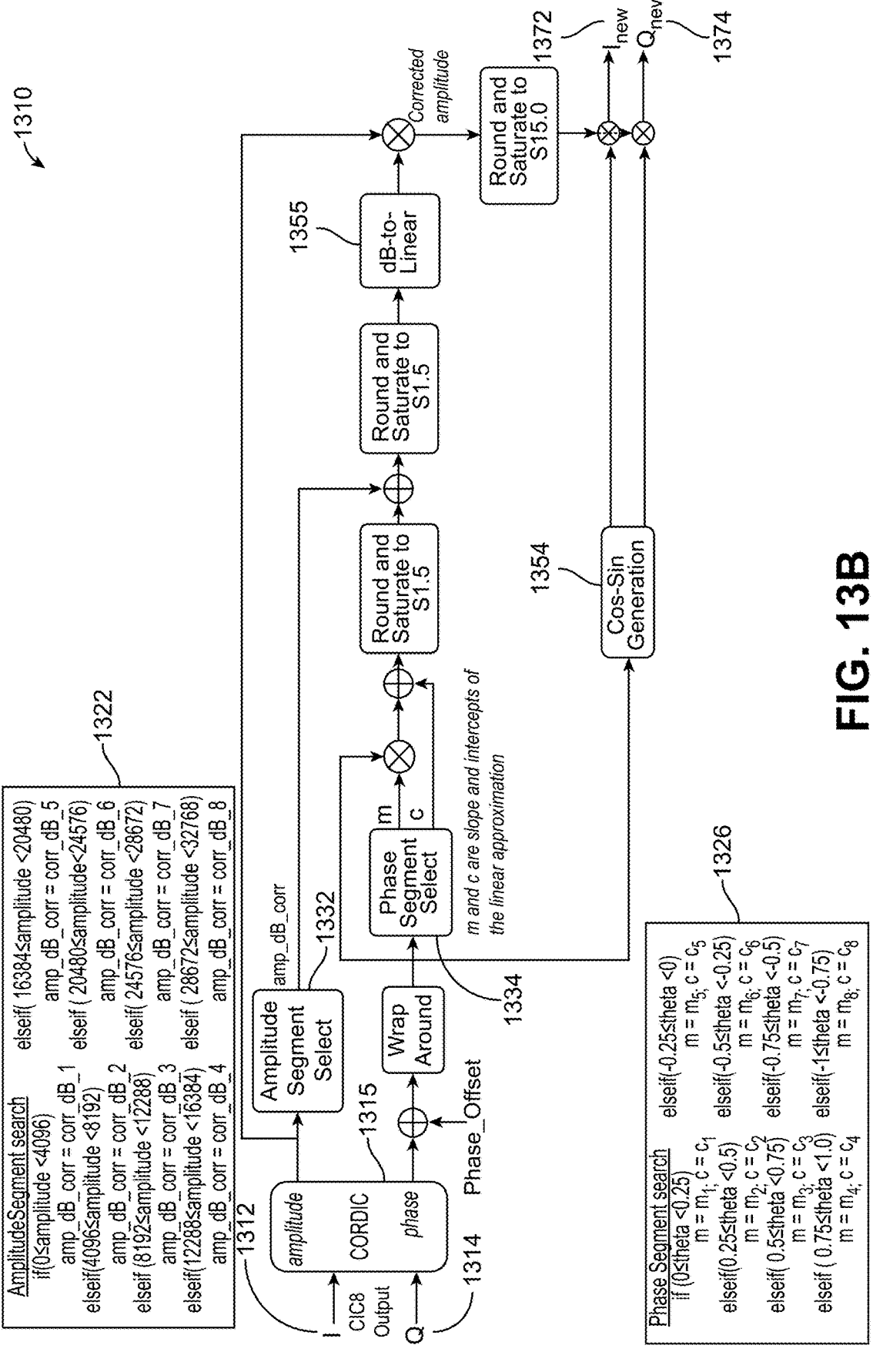
FIG. 13B is a diagram illustrating an example fixed point implementation of a phase modulation-amplitude modulation (PM-AM) compensation module, in accordance with some embodiments.
Figure 14:
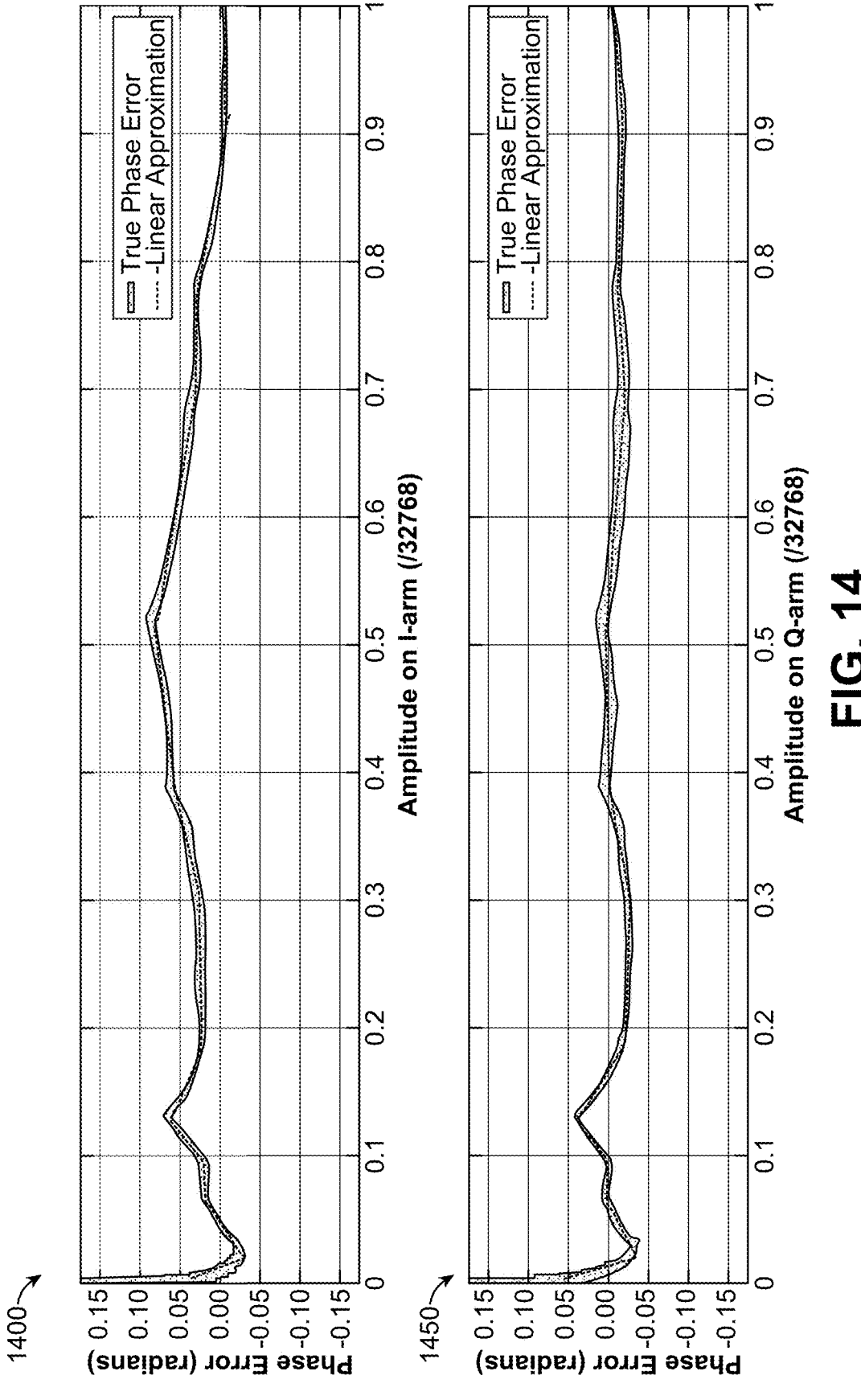
FIG. 14 is a diagram illustrating an example of true phase errors corresponding to a pre-compensated sample output on the I and Q paths, in accordance with some embodiments.

In some embodiments, a programmable phase offset feature can be implemented to account for any shift in the PM-AM characteristic. In addition, an amplitude-based correction factor can be provided and used to offer more flexibility, where the amplitude scale is divided into a plurality of segments with each respective segment having a corresponding amplitude correction factor. FIG. 13B is a diagram illustrating an example fixed point implementation of a PM-AM compensation module 1310, according to an embodiment of the present invention. A cartesian IQ sample (e.g., including an I sample 1312 and a Q sample 1314) is converted to an amplitude and phase by a CORDIC 1315.

From the CORDIC 1315, an amplitude segment select module 1332 is used to select an amplitude correction value, based on the amplitude determined by the CORDIC 1315 for the IQ sample inputs 1312, 1314. In some embodiments, the amplitude segment select module 1332 can be configured to select or determine the corresponding amplitude correction value based on the implementing the amplitude segment search algorithm 1322 (e.g., amplitude segment search logic).

In some embodiments, a slope (m) and an intercept (c) for linear approximation are selected by a phase segment select module 1334 according to the phase of the IQ sample 1312, 1314 as determined by the CORDIC 1315. In some examples, the slope (m) and an intercept (c) can be determined by the phase segment select module 1334 using the phase segment search algorithm 1326 (e.g., phase segment search logic), and can subsequently be used to derive a corresponding amplitude correction. The amplitude correction is then mapped to a linear value by a dB-to-Linear module 1355. In some embodiments, a cosine-sine generation block 1354 can be used to derive cos/sin values from a normalized phase, with the output cos/sin values from the cosine-sine generation block 1354 being combined with the corrected amplitude information from the output of the dB-to-Linear module 1355, to thereby generate the output $I_{new}$ 1372 and the output $Q_{new}$ 1374.

As noted briefly above, in addition to PM-AM distortion, it is also observed that there is an AM-PM (e.g., cross-talk) DPA distortion, which refers to a changing amplitude resulting in a phase distortion in the output of the DPA. The phase distortion can be caused by different clock delays to different elements of the DPA, and/or can be caused by changes to complex impedances as different numbers of DAC cells are activated, and/or can be caused by various other mechanisms. In multi-section DPA architectures, amplitude codes get split across the multiple sections, and the AM-PM distortion characteristic tends to have a structure that repeats the characteristic of each individual section as codes are allocated to each section in turn. The AM-PM distortion results in the modification of original IQ complex samples such that the I path is distorted by a portion of the Q path and vice-versa.

A complex baseband sample at sample time k is given by I[k]+jQ[k], where I[k] and Q[k] represent the in-phase and quadrature-phase components. The complex baseband sample in polar form is represented by:

$$I[k] + jQ[k] = r[k]e^{j\theta[k]} \qquad \text{Eq. (27)}$$

In Eq. (27), the terms r[k] and θ[k] represent the amplitude and modulation phase of the baseband sample, respectively. Because the AM-PM effect distorts the phase, the phase component includes a phase error that is proportional to the amplitude component. The distorted IQ sample is represented by:

$$I_d[k] + jQ_d[k] = r[k]e^{j(\theta[k]+\Delta\theta[k])} \qquad \text{Eq. (28)}$$

In Eq. (28), the term $\Delta\theta[k]$ represents the phase distortion component and is a function of the amplitude component:

$$\Delta\theta[k] = f(r[k]) \qquad \text{Eq. (29)}$$

Expanding $I_d[k]+jQ_d[k]$ gives:

$$I_d[k] = I[k]\cos\Delta\theta[k] - Q[k]\sin\Delta\theta[k] \qquad \text{Eq. (30)}$$

The expression $Q_d[k]=Q[k] \cos \Delta\theta[k]-I[k]\sin \Delta\theta[k]$ assumes that the phase distortion component is small, so in some cases, the approximations $\cos(\Delta\theta[k]){\approx}1$ and $\sin(\Delta\theta[k]{\sim}\Delta\theta[k]$ may be used to simplify the implementation of the pre-compensation for the AM-PM distortion. For instance, applying these approximations, the above equations are simplified to:

$$I_d[k] \approx I[k] - Q[k]\Delta\theta[k] \qquad \text{Eq. (31)}$$

$$Q_d[k] \approx Q[k] + I[k]\Delta\theta[k] \qquad \text{Eq. (32)}$$

From bench results, a more generic model can be characterized, where the phase distortion components can be represented independently as functions of the amplitudes on the in-phase (I) and quadrature-phase (Q) arms:

$$I_d[k] \approx I[k] - Q[k]\sin\Delta\theta_Q[k] \qquad \text{Eq. (33)}$$

$$Q_d[k] \approx Q[k] - I[k]\sin\Delta\theta_I[k] \qquad \text{Eq. (34)}$$

With $\Delta\theta_I[k]=f(|I[k]|)$ and $\Delta\theta_Q[k]=f(|Q[k]|)$, Eqs. (33) and (34) can be written in a matrix form:

$$\begin{bmatrix} I_d[k] \\ Q_d[k] \end{bmatrix} \approx \begin{bmatrix} 1 & -\Delta\theta_Q[k] \\ \Delta\theta_I[k] & 1 \end{bmatrix}\begin{bmatrix} I[k] \\ Q[k] \end{bmatrix}, D = \begin{bmatrix} 1 & -\Delta\theta_Q[k] \\ \Delta\theta_I[k] & 1 \end{bmatrix} \qquad \text{Eq. (35)}$$

In Eq. (35), the matrix D is referred to as the distortion matrix.

In some embodiments of pre-compensating the AM-PM distortion, the systems and techniques described herein can be configured to transform the original complex baseband samples using a pre-compensation matrix C, which may be derived from the distortion matrix D:

$$C = \begin{bmatrix} 1 & -\Delta\theta_Q[k] \\ \Delta\theta_I[k] & 1 \end{bmatrix} \qquad \text{Eq. (36)}$$

The pre-compensation matrix C is derived to reverse the effect of the AM-PM distortion on the original complex baseband samples $I[k]+jQ[k]$, for example such that $CD{\approx}1$. The pre-compensation samples $I_C[k]+jQ_C[k]$ are therefore given by:

$$\begin{bmatrix} I_c[k] \\ Q_c[k] \end{bmatrix} = C\begin{bmatrix} I[k] \\ Q[k] \end{bmatrix} \qquad \text{Eq. (37)}$$

That is, the in-phase ($I_c$) and quadrature-phase ($Q_c$) components of the baseband samples after pre-compensation become:

$$I_c[k] = I[k] - Q[k]\Delta\theta_Q[k] \qquad \text{Eq. (38)}$$

$$Q_d[k] = Q[k] - I[k]\Delta\theta_I[k] \qquad \text{Eq. (39)}$$

Because the phase distortion is a function of the amplitude of the in-phase or quadrature-phase samples, the I and Q amplitude axis can be divided into N segments, and the phase distortion can be modeled by a piecewise linear fit as a function of the amplitude. The segments can be equal or unequal lengths. The slopes and intercepts of these segments are used to determine the phase distortion as a function of the amplitude. After determining the phase distortion on both the I and Q arms, the pre-compensated sample output can be formed using the relations above. FIG. depicts a first plot 1400 and a second plot 1450, where the first plot 1400 depicts a plot of true phase errors as a function of amplitude on the in-phase path, and the second plot 1450 depicts a plot of true phase errors as a function of amplitude on the quadrature-phase paths, with both plots 1400 and 1450 utilizing piecewise linear approximation across different segments.

Figure 15:
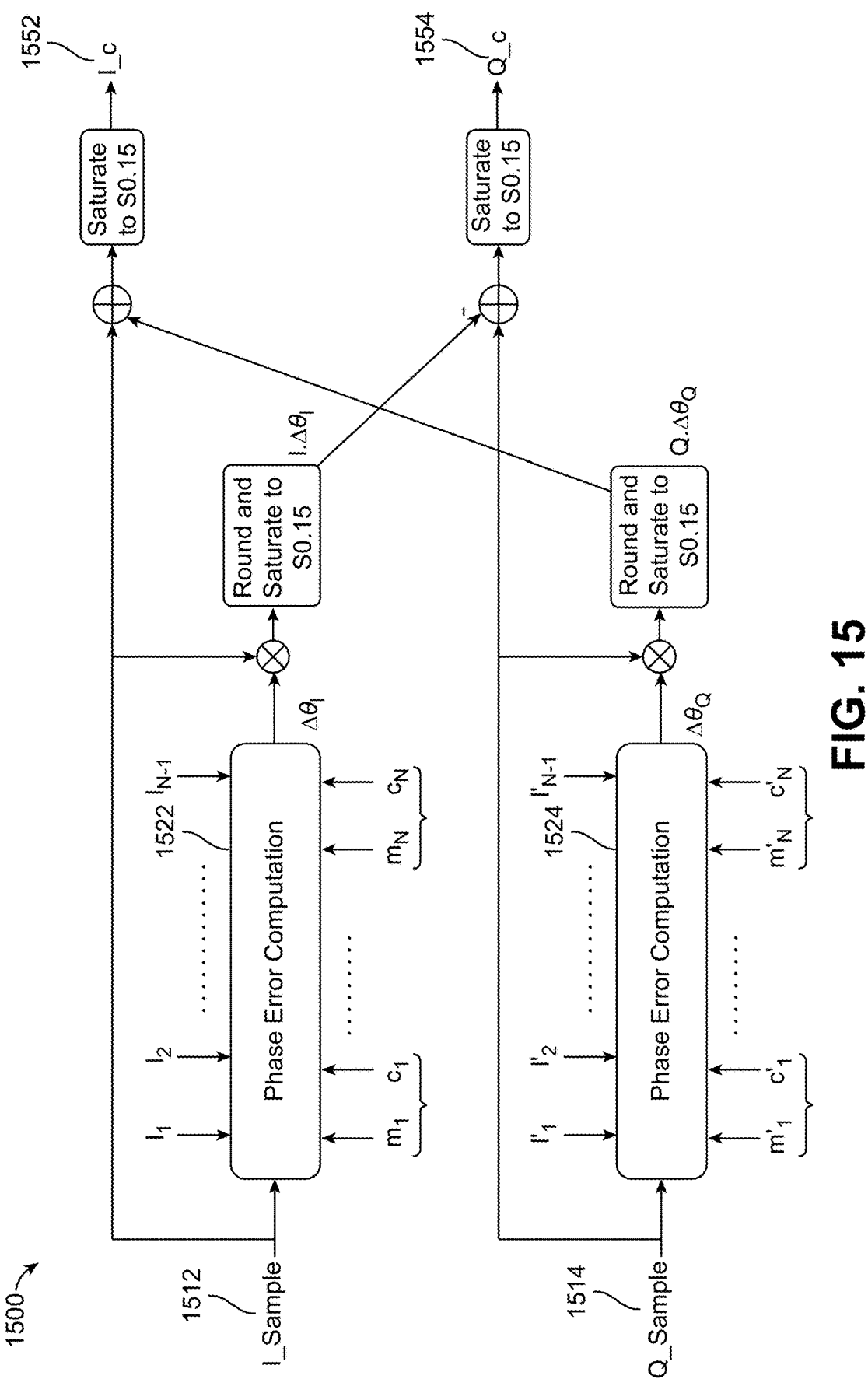
FIG. 15 is a diagram illustrating an example of an AM-PM compensation module including a first phase error computation block for determining the phase error of the I component and a second phase error computation block for determining the phase error of the Q component, in accordance with some embodiments.

Embodiments of the AM-PM compensation block described herein can include a phase error computation block which takes the in-phase or quadrature-phase sample as input, and generates as output a phase error proportional to the magnitude of its input. For example, FIG. 15 is a diagram illustrating an example of an AM-PM compensation module 1500 including a first phase error computation block 1522 for determining the phase error of the I component (e.g., I sample 1512) and a second phase error computation block 1524 for determining the phase error of the Q component (e.g., Q sample 1514), in accordance with some examples.

To facilitate ease of implementation, some embodiments of the phase error computation block 1522, 1524 can be configured to divide the amplitude axis into N segments with endpoints, $I_1$, $I_2$, . . . , $I_N$. Each segment may have different ranges of amplitudes. In some embodiments, the phase error model across each segment is represented by a straight line with slope and intercept parameters, $m_i$, $c_i$, respectively. The phase error computation block 1522 in the AM-PM compensation block 1500 used on the in-phase component 1512 generates the corresponding output of $\Delta\theta_1$. The phase error computation block 1524 in the AM-PM compensation block 1500 used on the quadrature-phase component 1514 generates the corresponding output of $\Delta\theta_Q$.

In some embodiments, the AM-PM compensation block 1500 and/or the phase error computation blocks 1522, 1524 can be designed and/or configured to select appropriate interval endpoints, slope and intercept parameters for the in-phase and quadrature-phase components 1512 and 1514, respectively. The phase error of the I component 1512, $Q\Delta\theta_Q$, is computed by the phase error computation block 1524 receiving the Q component 1514 as input, and is combined with the I component 1512 of the original samples to produce the pre-compensated output I_c 1552, as shown in FIG. 15. Similarly, the phase error of the Q component 1514, $I\Delta\theta_1$, is computed by the phase error computation block 1522 receiving the I component 1512 as input, and is combined with the Q component 1514 of the original samples to produce the pre-compensated output Q_c 1554, as also shown in FIG. 15.

Figure 16:
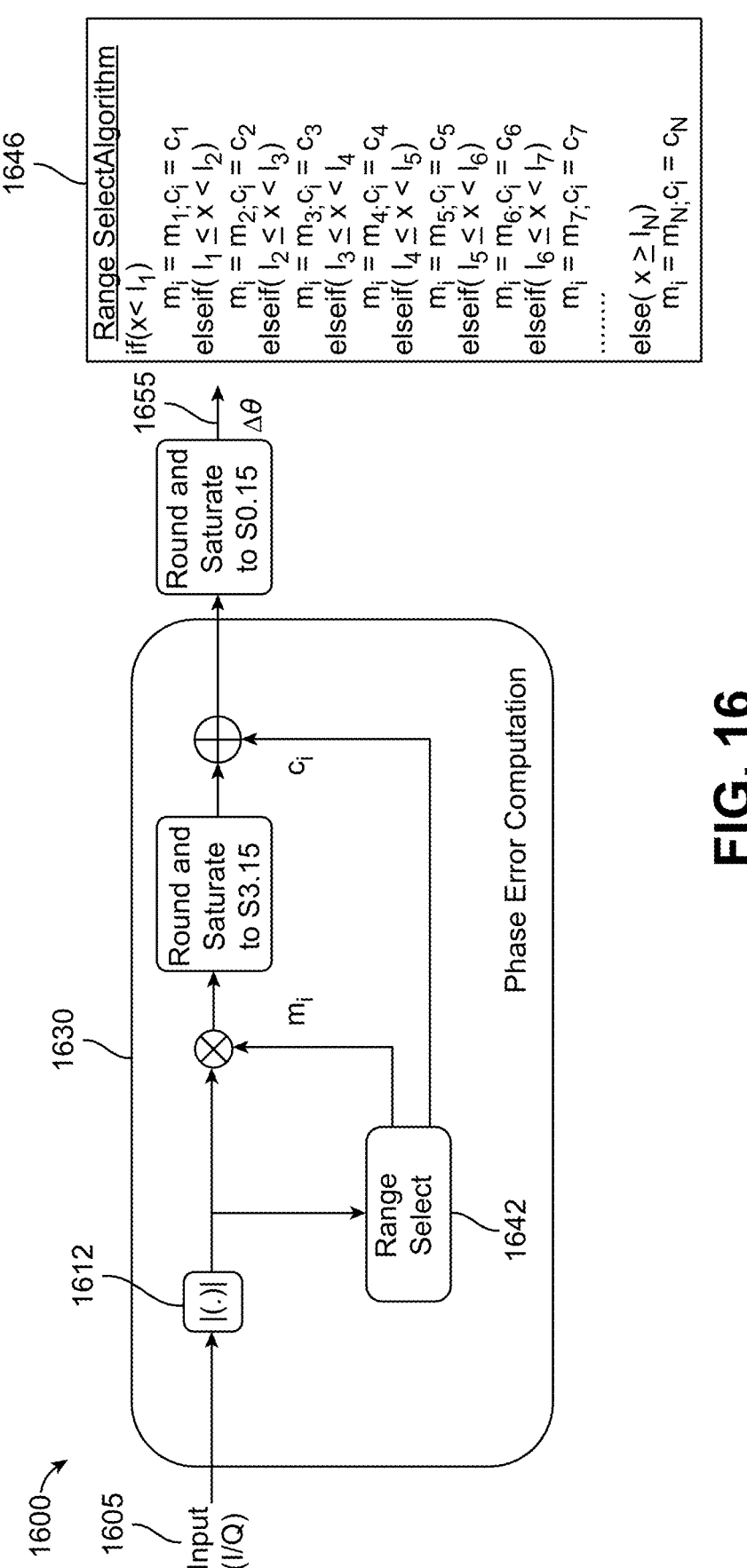
FIG. 16 is a diagram illustrating an example architecture of the phase error computation block(s) of FIG. 15, in accordance with some embodiments.

An embodiment of the architecture of the phase error computation block is shown in FIG. 16. For example, FIG. 16 is a diagram illustrating an example architecture 1600 of a phase error computation block 1630, which can be the same as or similar to the phase error computation block 1522 and/or the phase error computation block 1524 of FIG. 15, in accordance with some examples. Since the phase error is a function of the magnitude of the input (e.g., input IQ samples 1605), the magnitude of the incoming in-phase or quadrature-phase component is first computed by a magnitude computation block 1612. The determined magnitude from the magnitude computation block 1612 can be provided as input to a range select module 1642, configured to implement the range select algorithm 1646 to determine which configured interval (e.g., $I_1, I_2, \ldots, I_N$) to which the determined magnitude belongs. After determining a corresponding one of the intervals that contains the determined magnitude, the range select module 1642 and/or the range select algorithm 1646 can be used to determine the corresponding slope and intercept values (e.g., $m_i$, $c_i$) chosen to form the final phase error output term 1655 generated as output by the phase error computation block 1630 as Δθ. In some embodiments, the range select module 1642 of FIG. 16 can be the same as or similar to the range select module 1262 of FIG. 12, and/or the range select algorithm, 1646 of FIG. 16 can be the same as or similar to the range select algorithm 1264 of FIG. 12.

FIG. 17 is a flow diagram of an example of a process 1700 for performing signal compensation to digitally correct a gain characteristic of a Digital Power Amplifier (DPA). For example, the process 1700 can correspond to a compensation method for digitally correcting a gain characteristic of a DPA and/or ScPa. At block 1702, the process 1700 can include obtaining an in-phase (I) component and a quadrature-phase (Q) component of a baseband sample, wherein the I component is associated with in-phase input amplitude codes and the Q component is associated with quadrature-phase input amplitude codes. At block 1704, the process 1700 can include distorting the in-phase input amplitude codes, based on first gain pre-compensation information corresponding to an in-phase signal branch of a Digital Power Amplifier (DPA), to thereby generate pre-distorted output amplitude codes of the I component. At block 1706, the process 1700 can include distorting the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information. At block 1708, the process 1700 can include driving the DPA using the pre-distorted output amplitude codes of the I and Q components to generate a Radio Frequency (RF) output.

Figure 18:
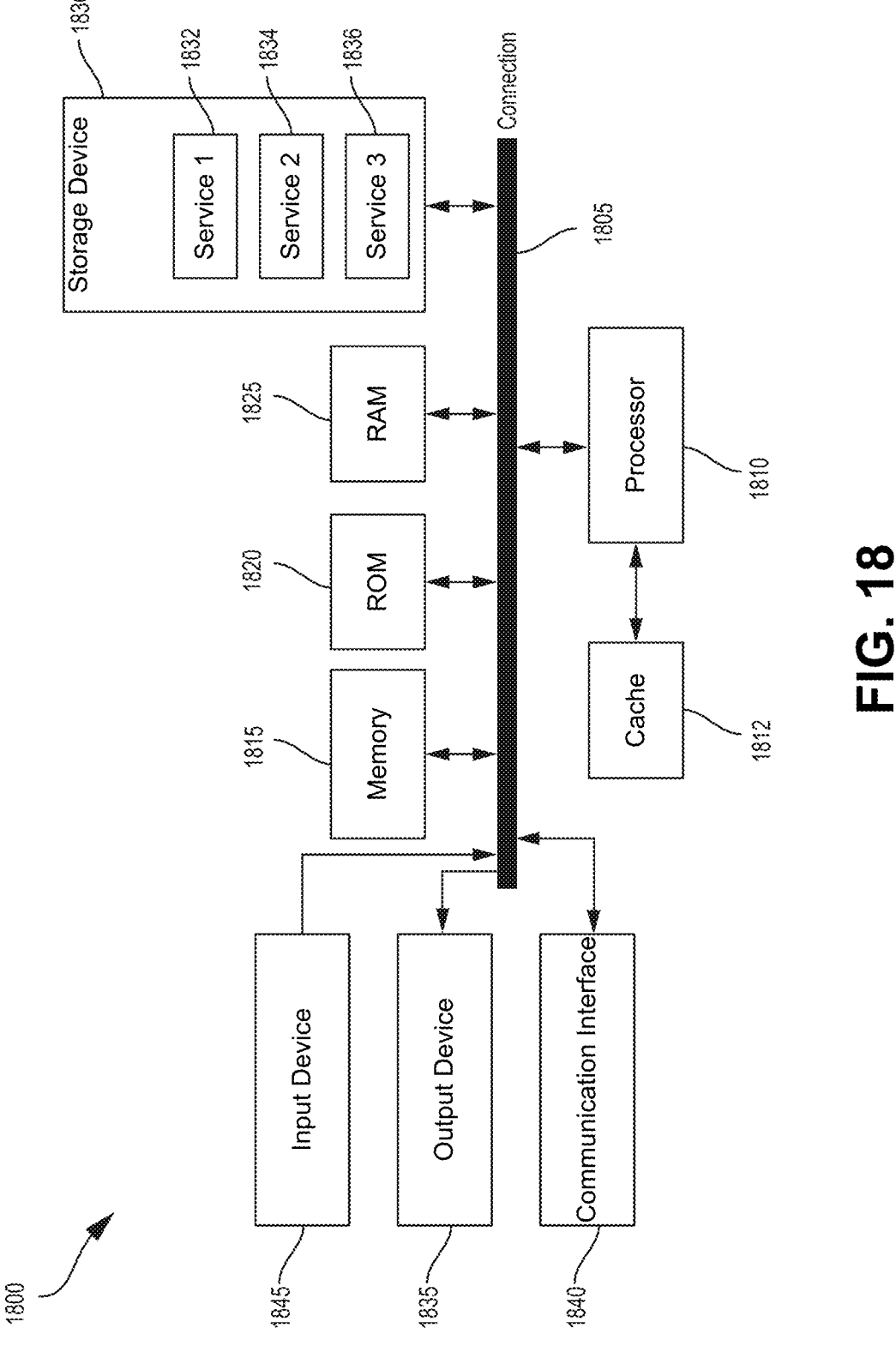
FIG. 18 is a block diagram illustrating an example of a computing system for implementing certain aspects described herein, in accordance with some embodiments.

FIG. 18 illustrates a computing device architecture 1800 of a computing device which can implement one or more techniques described herein. In some examples, the computing device can include a mobile device, a wearable device, an extended reality device (e.g., a Virtual Reality (VR) device, an Augmented Reality (AR) device, or a Mixed Reality (MR) device), a personal computer, a laptop computer, a video server, a vehicle (or computing device of a vehicle), or other device. The components of computing device architecture 1800 are shown in electrical communication with each other using connection 1805, such as a bus.

The computing device architecture 1800 includes a processing unit 1810 and computing device connection 1805 that couples various computing device components including computing device memory 1815, such as Read Only Memory (ROM) 1820 and Random-Access Memory (RAM) 1825, to processor 1810.

Computing device architecture 1800 can include a cache of high-speed memory connected directly with, in close proximity to, or integrated as part of processor 1810. Computing device architecture 1800 can copy data from memory 1815 and/or the storage device 1830 to cache 1812 for quick access by processor 1810. In this way, the cache can provide a performance boost that avoids processor 1810 delays while waiting for data. These and other engines can control or be configured to control processor 1810 to perform various actions. Other computing device memory 1815 may be available for use as well. Memory 1815 can include multiple different types of memory with different performance characteristics. Processor 1810 can include any general-purpose processor and a hardware or software service, such as service 1 1832, service 2 1834, and service 3 1836 stored in storage device 1830, configured to control processor 1810 as well as a special-purpose processor where software instructions are incorporated into the processor design. Processor 1810 may be a self-contained system, containing multiple cores or processors, a bus, memory controller, cache, etc. A multi-core processor may be symmetric or asymmetric.

To enable user interaction with the computing device architecture 1800, input device 1845 can represent any number of input mechanisms, such as a microphone for speech, a touch-sensitive screen for gesture or graphical input, keyboard, mouse, motion input, speech and so forth. Output device 1835 can also be one or more of a number of output mechanisms known to those of skill in the art, such as a display, projector, television, speaker device, etc. In some instances, multimodal computing devices can enable a user to provide multiple types of input to communicate with computing device architecture 1800. Communication interface 1840 can generally govern and manage the user input and computing device output. There is no restriction on operating on any particular hardware arrangement and therefore the basic features here may easily be substituted for improved hardware or firmware arrangements as they are developed.

Storage device 1830 is a non-volatile memory and can be a hard disk or other types of computer readable media which can store data that are accessible by a computer, such as magnetic cassettes, flash memory cards, solid state memory devices, digital versatile disks, cartridges, RAM, ROM, and hybrids thereof. Storage device 1830 can include services 1832, 1834, 1836 for controlling processor 1810. Other hardware or software modules or engines are contemplated. Storage device 1830 can be connected to the computing device connection 1805. In one aspect, a hardware module that performs a particular function can include the software or processor readable codes stored in a computer-readable medium in connection with the necessary hardware components, such as processor 1810, connection 1805, output device 1835, and so forth, to carry out the function.

The term "device" is not limited to one or a specific number of physical objects (such as one smartphone, one controller, one processing system and so on). As used herein, a device may be any electronic device with one or more parts that may implement at least some portions of this disclosure.

Individual aspects may be described above as a process or method which is depicted as a flowchart or a data flow diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, or a subprogram. When a process corresponds to a function, its termination can correspond to a return of the function to the calling function or the main function.

The techniques described herein may also be implemented in electronic hardware, computer software, firmware, or any combination thereof. Such techniques may be implemented in any of a variety of devices such as general purpose computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above.

The program code may be executed by a processor, which may include one or more processors, such as one or more Digital Signal Processors (DSPs), general purpose microprocessors, an Application Specific Integrated Circuits (ASICs), Field Programmable Gate Arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, microcontroller, or state machine. A processor may also be implemented as a combination of computing devices.

What is claimed is:

1. A compensation method for digitally correcting a gain characteristic of a Digital Power Amplifier (DPA), the method comprising:
 obtaining an in-phase (I) component and a quadrature-phase (Q) component of a baseband sample, wherein the I component is associated with in-phase input amplitude codes and the Q component is associated with quadrature-phase input amplitude codes;
 distorting the in-phase input amplitude codes, based on first gain pre-compensation information corresponding to an in-phase signal branch of the DPA, to thereby generate pre-distorted output amplitude codes of the I component;
 distorting the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information; and
 driving the DPA using the pre-distorted output amplitude codes of the I and Q components to generate a Radio Frequency (RF) output;
 wherein the DPA is a multi-section DPA, wherein the first gain pre-compensation information comprises a first pre-distortion characteristic comprising a first piecewise linear function over sections of the multi-section DPA, and the second gain pre-compensation information comprises a second pre-distortion characteristic comprising a second piecewise linear function over the sections of the multi-section DPA.

2. The compensation method of claim 1, wherein a non-linear gain applied by the DPA to generate the RF output is canceled by a respective pre-distortion associated with each of the pre-distorted output amplitude codes of the I component and the Q component.

3. The compensation method of claim 1, wherein the DPA is a multi-section DPA includes a plurality of sections arranged in a multi-section DPA configuration.

4. The compensation method of claim 3, further comprising:
 estimating a respective gain from each section of the plurality of sections in the multi-section DPA configuration; and
 deriving the first gain pre-compensation information and the second gain pre-compensation information based on the respective gain estimated from each section.

5. The compensation method of claim 3, wherein a number of linear sections included within the first or second piecewise linear functions corresponds to a number of sections in the multi-section DPA configuration.

6. The compensation method of claim 1, wherein the DPA is a Switched-capacitor Power amplifier (ScPa) including a plurality of sections.

7. The compensation method of claim 1, wherein:
 the DPA includes at least a first section and a second section;
 a range of possible output amplitude codes of the I component is divided into a first interval and a second interval; and
 a range of possible output amplitude codes of the Q component is divided into a first interval and a second interval.

8. The compensation method of claim 7, wherein:
 the first section of the DPA is controlled by one or more of: pre-distorted output amplitude codes of the I component within the first interval or pre-distorted output amplitude codes of the Q component within the second interval; and
 the second section of the DPA is controlled by one or more of: pre-distorted output amplitude codes of the Q component within the first interval or pre-distorted output amplitude codes of the I component within the second interval.

9. The compensation method of claim 1, further comprising compensating a Phase Modulation (PM)-Amplitude Modulation (AM) distortion of the baseband sample according to a phase component of the baseband sample.

10. The compensation method of claim 9, wherein the DPA is a multi-section DPA including a plurality of sections, and wherein compensating the PM-AM distortion includes:
 converting initial I and Q components of the baseband sample into an amplitude component and the phase component;
 selecting a respective section from the plurality of sections of the multi-section DPA, wherein the respective section is selected based on the phase component of the baseband sample, and wherein the respective section is associated with a slope and an intercept corresponding to a gain characteristic of the multi-section DPA within the respective section;
 deriving an amplitude correction value for the baseband sample based on the slope and the intercept corresponding to the gain characteristic of the multi-section DPA within the respective section; and computing a pre-distorted amplitude for the baseband sample from the amplitude component and the amplitude correction value, wherein the I and Q components of the baseband sample are generated using the pre-distorted amplitude.

11. The compensation method of claim 1, further comprising compensating an Amplitude Modulation (AM)-Phase Modulation (PM) distortion of the baseband sample according to the I and Q components of the baseband sample.

12. The compensation method of claim 11, wherein the DPA is a multi-section DPA including a plurality of sections, and wherein compensating the AM-PM distortion includes:

selecting a respective section from the plurality of sections of the multi-section DPA, wherein the respective section is selected based on an initial Q component of the baseband sample, and wherein the respective section is associated with a slope and an intercept corresponding to a gain characteristic of the multi-section DPA within the respective section;

deriving a phase error based on the slope and the intercept corresponding to the gain characteristic of the multi-section DPA within the respective section; and computing a pre-compensated output based on an initial I component of the baseband sample and the phase error, wherein the I component of the baseband sample is the pre-compensated output.

13. The compensation method of claim 11, wherein the DPA is a multi-section DPA including a plurality of sections, and wherein compensating the AM-PM distortion includes:

selecting a respective section from the plurality of sections of the multi-section DPA, wherein the respective section is selected based on an initial I component of the baseband sample, and wherein the respective section is associated with a slope and an intercept corresponding to corresponding to a gain characteristic of the multi-section DPA within the respective section;

deriving a phase error based on the slope and the intercept corresponding to the gain characteristic of the multi-section DPA within the respective section; and computing a pre-compensated output based on an initial Q component of the baseband sample and the phase error, wherein the Q component of the baseband sample is the pre-compensated output.

14. The compensation method of claim 1, wherein the method further comprising:

obtaining an amplitude component and a phase component of the baseband sample;

selecting, based on the phase component of the baseband sample, a respective section from a plurality of sections included in the DPA;

determining a slope and an intercept corresponding to a gain characteristic or a gain error of the DPA within the respective section;

deriving an amplitude correction value for the baseband sample based on the slope and the intercept; and computing a pre-distorted amplitude for the baseband sample from the amplitude component and the amplitude correction value, wherein the I and Q components of the baseband sample are generated using the pre-distorted amplitude and the phase component.

15. The compensation method of claim 1, wherein the method further comprising:

determining a selected I segment from a plurality of I segment ranges configured for the DPA, wherein the selected I segment is selected based on a value of the I component of the baseband sample;

determining an I slope and an I intercept corresponding to the selected I segment;

determining a selected Q segment from a plurality of Q segment ranges configured for the DPA, wherein the selected Q segment is selected based on a value of the Q component of the baseband sample;

determining a Q slope and a Q intercept corresponding to the selected Q segment;

deriving a Q phase error based on the I slope and the I intercept, and deriving an I phase error based on the Q slope and the Q intercept; and computing a pre-compensated Q output from the Q component and the Q phase error, and computing a pre-compensated I output from the I component and the I phase error;

wherein the pre-distorted output amplitude codes of the I and Q components are derived using the pre-compensated I and Q outputs.

16. A wireless device transmitting Radio Frequency (RF) signal on a wireless medium, comprising:

one or more digital filters configured to receive and upsample an In-phase (I) component and a Quadrature-phase (Q) component of a baseband sample, wherein the I component is associated with in-phase input amplitude codes and the Q component is associated with quadrature-phase input amplitude codes;

a Power Amplifier (PA) gain error compensation module coupled to the one or more digital filters, wherein the PA gain error compensation module is configured to:

distort the in-phase input amplitude codes, based on first gain pre-compensation information corresponding to an in-phase signal branch of a Digital Power Amplifier (DPA), to thereby generate pre-distorted output amplitude codes of the I component; and distort the quadrature-phase input amplitude codes, based on second gain pre-compensation information corresponding to a quadrature-phase signal branch of the DPA, to thereby generate pre-distorted output amplitude codes of the Q component, wherein the first gain pre-compensation information is different from the second gain pre-compensation information; and the DPA coupled to the PA gain error compensation module, the DPA configured to generate an RF output based on the pre-distorted output amplitude codes of the I and Q components;

wherein the DPA is a multi-section DPA, wherein the first gain pre-compensation information comprises a first pre-distortion characteristic comprising a first piecewise linear function over sections of the multi-sections DPA, and the second gain pre-compensation information comprises a second pre-distortion characteristic comprising a second piecewise linear function over the sections of the multi-section DPA.

17. The wireless device of claim 16, further comprising one or more of:

a Phase Modulation (PM)-Amplitude Modulation (AM) compensation module coupled to the one or more digital filters and the PA gain error compensation module, wherein the PM-AM compensation module is configured to correct a PM-AM distortion of the baseband sample based on a phase component of the baseband sample; or an AM-PM compensation module coupled to the one or more digital filters and the PA gain error compensation module, wherein the AM-PM compensation module is configured to correct an AM-PM distortion of the baseband sample based on phase errors derived from the I and Q components of the baseband sample.

18. The wireless device of claim 17, further comprising:

a cartesian to polar converter coupled to the one or more digital filters and configured to convert the I and Q components of the baseband sample into an amplitude component and the phase component;

wherein the PM-AM compensation module is further configured to:

determine a selected section from a plurality of sections included in the DPA based on the phase component of the baseband sample, wherein the selected section is associated with a slope and an intercept corresponding to the selected section;

derive an amplitude correction value for the baseband sample based on the slope and the intercept of the selected section; and compute a pre-distorted amplitude for the baseband sample from the amplitude component and the amplitude correction value; and wherein the PA gain error compensation module is configured to receive the I and Q components of the baseband samples derived using the pre-distorted amplitude computed by the PM-AM compensation module.

* * * * *